(12) United States Patent
Tomioka et al.

(10) Patent No.: US 8,916,333 B2
(45) Date of Patent: Dec. 23, 2014

(54) RADIATION-SENSITIVE RESIN COMPOSITION

(71) Applicant: JSR Corporation, Tokyo (JP)

(72) Inventors: Hiroshi Tomioka, Tokyo (JP); Noboru Otsuka, Tokyo (JP); Akimasa Soyano, Tokyo (JP)

(73) Assignee: JSR Corporation, Tokyo (JP)

( * ) Notice: Subject to any disclaimer, the term of this patent is extended or adjusted under 35 U.S.C. 154(b) by 88 days.

(21) Appl. No.: 13/629,769

(22) Filed: Sep. 28, 2012

(65) Prior Publication Data

US 2013/0022926 A1 Jan. 24, 2013

Related U.S. Application Data

(63) Continuation of application No. PCT/JP2011/057920, filed on Mar. 29, 2011.

(30) Foreign Application Priority Data

Mar. 31, 2010 (JP) ................... 2010-084491

(51) Int. Cl.
*G03F 7/004* (2006.01)
*G03F 7/039* (2006.01)

(52) U.S. Cl.
CPC ............ *G03F 7/0397* (2013.01); *G03F 7/0045* (2013.01); *Y10S 430/111* (2013.01); *Y10S 430/122* (2013.01)
USPC .......................... 430/270.1; 430/910; 430/921

(58) Field of Classification Search
CPC .............................. G03F 7/0045; G03F 7/0397
USPC ........................ 430/270.1, 910, 921
See application file for complete search history.

(56) References Cited

U.S. PATENT DOCUMENTS

| 5,744,537 A | 4/1998 | Brunsvold et al. | |
| 5,910,392 A | 6/1999 | Nozaki et al. | |
| 8,431,324 B2* | 4/2013 | Shimokawa et al. | ...... 430/270.1 |
| 2010/0285405 A1* | 11/2010 | Shimokawa et al. | ...... 430/270.1 |

FOREIGN PATENT DOCUMENTS

| EP | 0159428 | 10/1985 |
| JP | 6-12452 B2 | 5/1984 |
| JP | 5-18898 | 7/1993 |
| JP | 07-224056 | 8/1995 |
| JP | 10-133377 | 5/1998 |
| JP | 2000-336121 | 12/2000 |
| JP | 2001-022073 | 1/2001 |
| JP | 2001-109154 | 4/2001 |
| JP | 2007-145823 | 6/2007 |
| JP | 2009-188318 | 8/2009 |
| JP | 2009-223294 | 10/2009 |
| JP | 2010-066503 | 3/2010 |

OTHER PUBLICATIONS

J.V. Crivello, "Cationic Polymerization-Iodonium and Sulfonium Salt Photoinitiators", Advances in Polymer Science, 1984, p. 1-48, vol. 62.
International Search Report for corresponding International Application No. PCT/JP2011/057920, Jun. 14, 2011.
Japanese Office Action in corresponding application No. 2012-509496, dated Jun. 3, 2014.

\* cited by examiner

*Primary Examiner* — John Chu
(74) *Attorney, Agent, or Firm* — Oblon, Spivak, McClelland, Maier & Neustadt, L.L.P.

(57) ABSTRACT

A radiation-sensitive resin composition includes a polymer and a photoacid generator. The polymer includes a first structural unit shown by a formula (a1), a second structural unit shown by a formula (a2), and a third structural unit having a lactone structure. A content of the first structural unit in the polymer being 50 mol % or more based on total structural units included in the polymer. The first structural unit is preferably a structural unit shown by a formula (a1-1).

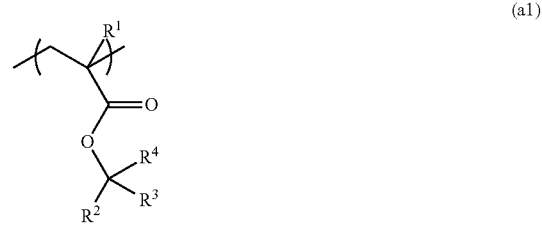

(a1)

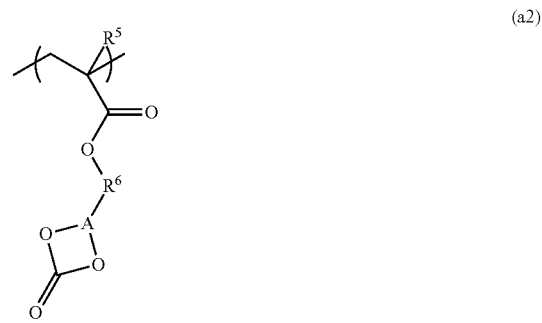

(a2)

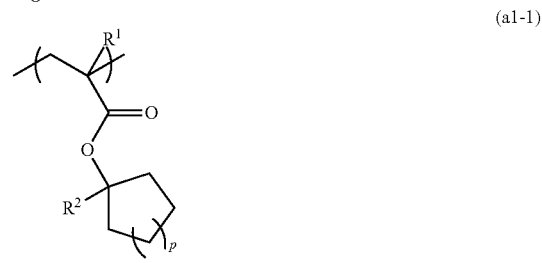

(a1-1)

6 Claims, No Drawings

RADIATION-SENSITIVE RESIN COMPOSITION

CROSS-REFERENCE TO RELATED APPLICATIONS

The present application is a continuation application of International Application No. PCT/JP2011/057920, filed Mar. 29, 2011, which claims priority to Japanese Patent Application No. 2010-084491, filed Mar. 31, 2010. The contents of these applications are incorporated herein by reference in their entirety.

BACKGROUND OF THE INVENTION

1. Field of the Invention

The invention relates to a radiation-sensitive resin composition.

2. Discussion of the Background

Photolithography that utilizes a chemically-amplified radiation-sensitive resin composition has been used in the production of semiconductor devices (e.g., IC), liquid crystal devices, circuit boards (e.g., thermal head), and the like. When radiation (e.g., deep ultraviolet rays (e.g., KrF excimer laser light or ArF excimer laser light)) is applied to the chemically-amplified radiation-sensitive resin composition (application of radiation may be hereinafter referred to as "exposure"), an acid is generated in the area (exposed area) to which radiation has been applied, and a difference in solubility rate in a developer occurs between the exposed area and the unexposed area due to chemical reactions catalyzed by the acid. A resist pattern is formed on a substrate by utilizing the difference in solubility rate. A radiation-sensitive resin composition that contains an acid-labile group-containing polymer and a photoacid generator has been known as such a radiation-sensitive resin composition.

A radiation-sensitive resin composition that contains a polymer that has an alicyclic structure-containing acid-labile group and a lactone structure (Japanese Patent Application Publication (KOKAI) No. 2001-109154), a radiation-sensitive resin composition that contains a polymer that contains an acid-labile group and a cyclic carbonate structure (Japanese Patent Application Publication (KOKAI) No. 10-133377), and the like have been proposed as a radiation-sensitive resin composition used for exposure that utilizes ArF excimer laser light.

SUMMARY OF THE INVENTION

According to one aspect of the present invention, a radiation-sensitive resin composition includes a polymer and a photoacid generator. The polymer includes a first structural unit shown by a formula (a1), a second structural unit shown by a formula (a2), and a third structural unit having a lactone structure. A content of the first structural unit in the polymer being 50 mol % or more based on total structural units included in the polymer.

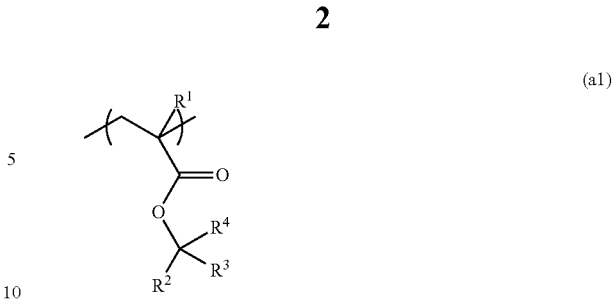

(a1)

$R^1$ represents a hydrogen atom or a methyl group. Each of $R^2$, $R^3$, and $R^4$ independently represents an alkyl group having 1 to 10 carbon atoms or a monovalent alicyclic hydrocarbon group having 4 to 20 carbon atoms, or $R^2$ represents an alkyl group having 1 to 10 carbon atoms or a monovalent alicyclic hydrocarbon group having 4 to 20 carbon atoms, and $R^3$ and $R^4$ taken together represent a divalent alicyclic hydrocarbon group having 4 to 20 carbon atoms together with the carbon atom bonded to $R^3$ and $R^4$.

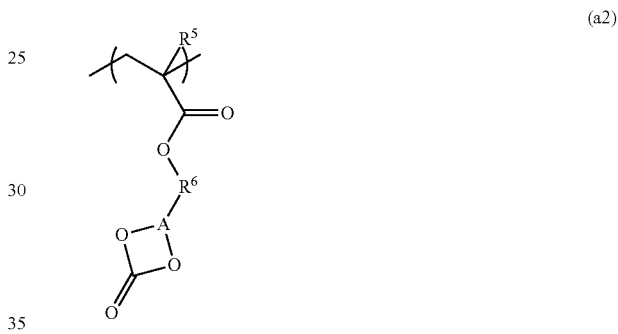

(a2)

$R^5$ represents a hydrogen atom or a methyl group. $R^6$ represents a single bond or a divalent hydrocarbon group having 1 to 10 carbon atoms. A represents a trivalent organic group.

DESCRIPTION OF THE EMBODIMENTS

According to an embodiment of the invention, a radiation-sensitive resin composition includes (A) a polymer that includes a structural unit (I) shown by a formula (a1), a structural unit (II) shown by a formula (a2), and a lactone structure-containing structural unit (III) (hereinafter may be referred to as "polymer (A)"), and (B) a photoacid generator (hereinafter may be referred to as "acid generator (B)"), a content of the structural unit (I) in the polymer (A) being 50 mol % or more based on total structural units included in the polymer (A),

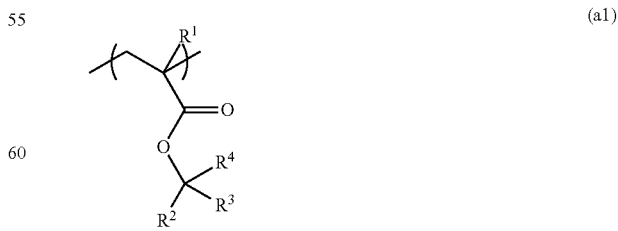

(a1)

wherein $R^1$ represents a hydrogen atom or a methyl group, and $R^2$, $R^3$, and $R^4$ independently represent an alkyl group having 1 to 10 carbon atoms or a monovalent alicyclic hydrocarbon group having 4 to 20 carbon atoms, provided that $R^3$ and $R^4$ may bond to each other to form a divalent alicyclic hydrocarbon group having 4 to 20 carbon atoms together with a carbon atom bonded to $R^3$ and $R^4$.

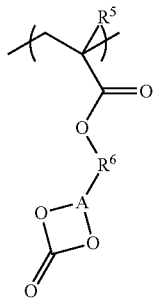

(a2)

wherein $R^5$ represents a hydrogen atom or a methyl group, $R^6$ represents a single bond or a divalent hydrocarbon group having 1 to 10 carbon atoms, and A represents a trivalent organic group.

Since the radiation-sensitive resin composition includes the polymer (A) that includes the structural unit (I) that includes the specific acid-labile group, the structural unit (II) that includes the specific cyclic carbonate structure, and the lactone structure-containing structural unit (III), and the acid generator (B), and has a content of the structural unit (I) within the specific range, the radiation-sensitive resin composition can achieve an improvement in depth of focus. The reason why the radiation-sensitive resin composition having the above configuration can achieve an improvement in depth of focus is not necessarily clarified. For example, it is conjectured that the structural unit (I) that provides a pattern-forming capability, the structural unit (II) that provides the exposed area with solubility in a developer, and the structural unit (III) that provides a resist film with adhesion to a substrate have a high synergistic effect when the content of the structural unit (I) is within the specific range.

It is preferable that the structural unit (I) be a structural unit (I-1) shown by the following formula (a1-1).

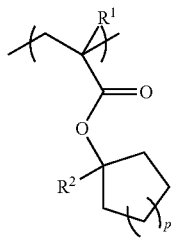

(a1-1)

wherein $R^1$ and $R^2$ are the same as defined for the formula (a1), and p is an integer from 0 to 4.

When the polymer (A) includes the structural unit (I-1) as the structural unit (I), it is conjectured that the pattern-forming capability is more appropriately adjusted, so that the depth of focus can be further improved. Moreover, the space pattern-forming capability of a resist film formed using the radiation-sensitive resin composition can be improved.

It is preferable that the acid generator (B) include a compound shown by the following formula (B1).

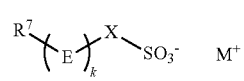

(B1)

wherein $R^7$ represents a monovalent hydrocarbon group having 10 or more carbon atoms that includes an alicyclic skeleton, provided that some or all of hydrogen atoms of the hydrocarbon group may be substituted with a substituent, E represents a single bond, —O—, —CO—O—*, or —O—CO—*, * indicates a site bonded to X, k is 0 or 1, X represents a divalent linear or branched alkanediyl group having 1 to 20 carbon atoms, provided that some or all of hydrogen atoms of the alkanediyl group may be substituted with a substituent, and $M^+$ represents a monovalent onium cation.

It is conjectured that the acid diffusion length of an acid generated by the acid generator (B) is reduced when the acid generator (B) includes the compound having the above specific structure, so that the depth of focus (DOF) can be further improved.

It is preferable that the hydrocarbon group represented by $R^7$ of the compound shown by the formula (B1) include an adamantane skeleton. It is conjectured that the acid diffusion length of an acid generated by the acid generator (B) is reduced when the hydrocarbon group represented by $R^7$ includes an adamantane skeleton, so that the depth of focus can be further improved.

It is preferable that the compound shown by the formula (B1) is a compound shown by the following formula (B1-1).

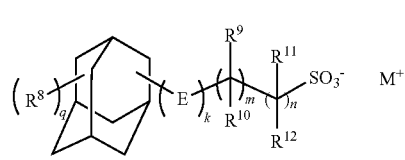

(B1-1)

wherein E, k, and $M^+$ are the same as defined for the formula (B1), $R^8$ represents a monovalent hydrocarbon group having 1 to 8 carbon atoms, provided that some or all of the hydrogen atoms of the hydrocarbon group may be substituted with a substituent, q is an integer from 0 to 4, provided that a plurality of $R^8$ may be either identical or different when q is an integer from 2 to 4, $R^9$ and $R^{10}$ independently represent a hydrogen atom or a monovalent hydrocarbon group having 1 to 8 carbon atoms, provided that some or all of the hydrogen atoms of the hydrocarbon group may be substituted with a substituent, m is an integer from 0 to 10, provided that a plurality of $R^9$ and a plurality of $R^{10}$ may respectively be either identical or different when m is an integer from 2 to 10, $R^{11}$ and $R^{12}$ independently represent a fluorine atom or a perfluoroalkyl group having 1 to 4 carbon atoms, and n is an integer from 1 to 4, provided that a plurality of $R^{11}$ and a plurality of $R^{12}$ may respectively be either identical or different when n is an integer from 2 to 4.

It is conjectured that an acid generated by the acid generator (B) has moderately high acidity when the acid generator (B) includes the compound having the above specific structure, so that the depth of focus can be further improved.

It is preferable that $M^+$ of the compound shown by the formula (B1) represent at least one cation selected from the group consisting of a cation shown by the following formula (b1) and a cation shown by the following formula (b2).

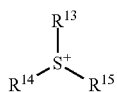

(b1)

wherein $R^{13}$, $R^{14}$, and $R^{15}$ independently represent a linear or branched alkyl group having 1 to 10 carbon atoms or an aryl group having 6 to 18 carbon atoms, provided that some or all of the hydrogen atoms of the alkyl group or the aryl group may be substituted with a substituent, and $R^{14}$ and $R^{15}$ may bond to each other to form a cyclic structure together with a sulfur atom bonded to $R^{14}$ and $R^{15}$.

wherein $R^{16}$ and $R^{17}$ independently represent a linear or branched alkyl group having 1 to 10 carbon atoms or an aryl group having 6 to 18 carbon atoms, provided that some or all of the hydrogen atoms of the alkyl group or the aryl group may be substituted with a substituent, and $R^{16}$ and $R^{17}$ may bond to each other to form a cyclic structure together with an iodine atom bonded to $R^{16}$ and $R^{17}$.

It is conjectured that the sensitivity is improved when $M^+$ is the cation having the above specific structure, so that the depth of focus can be further improved.

The content of each structural unit in the polymer (A) may be determined by measuring the $^{13}$C-NMR spectrum of the polymer (A), and calculating the content of each structural unit as an average value from the area ratio of the peak corresponding to each structural unit in the $^{13}$C-NMR spectrum.

Since the radiation-sensitive resin composition includes the polymer (A) that includes the specific structural units within the specific range, and the acid generator (B), the radiation-sensitive resin composition can achieve an improvement in depth of focus.

The embodiments will now be described in detail.

Radiation-sensitive Resin Composition

A radiation-sensitive resin composition according to one embodiment of the invention includes (A) a polymer and (B) an acid generator. The radiation-sensitive resin composition may preferably include (C) an acid diffusion controller and/or (D) a solvent, and may include an additional optional component as long as the effects of the invention are not impaired. Each component is described below.

Polymer (A)

The polymer (A) includes a structural unit (I), a structural unit (II), and a structural unit (III), the content of the structural unit (I) in the polymer (A) being 50 mol % or more based on the total structural units included in the polymer (A). Each structural unit is described below.

Structural Unit (I)

The structural unit (I) is shown by the formula (a1). The acid-labile group shown by —$CR^2R^3R^4$ that is included in the structural unit (I) dissociates due to an acid generated by the acid generator (B) upon exposure, so that the solubility of the exposed area of the polymer (A) in an alkaline developer increases due to deprotection of the carboxyl group. This makes it possible to form a resist pattern.

$R^1$ in the formula (a1) represents a hydrogen atom or a methyl group, and $R^2$, $R^3$, and $R^4$ independently represent an alkyl group having 1 to 10 carbon atoms or a monovalent alicyclic hydrocarbon group having 4 to 20 carbon atoms, provided that $R^3$ and $R^4$ may bond to each other to form a divalent alicyclic hydrocarbon group having 4 to 20 carbon atoms together with the carbon atom bonded to $R^3$ and $R^4$.

$R^1$ preferably represents a methyl group.

Examples of the alkyl group having 1 to 10 carbon atoms represented by $R^2$, $R^3$, and $R^4$ include a methyl group, an ethyl group, an n-propyl group, an i-propyl group, an n-butyl group, a 1-methylpropyl group, a 2-methylpropyl group, a t-butyl group, an n-pentyl group, an n-hexyl group, an n-heptyl group, an n-octyl group, an n-nonyl group, an n-decyl group, and the like. Among these, a methyl group, an ethyl group, an n-propyl group, and an i-propyl group are preferable since the acid-labile group shown by —$CR^2R^3R^4$ exhibits a moderate dissociation capability.

Examples of the monovalent alicyclic hydrocarbon group having 4 to 20 carbon atoms represented by $R^2$, $R^3$, and $R^4$ and a divalent alicyclic hydrocarbon group having 4 to 20 carbon atoms formed by $R^3$ and $R^4$ together with the carbon atom bonded to $R^3$ and $R^4$ include groups obtained by removing one or two hydrogen atoms from a monocyclic cycloalkane such as cyclobutane, cyclopentane, cyclohexane, cycloheptane, or cyclooctane, or a bridged alicyclic hydrocarbon such as adamantane, bicyclo[2.2.1]heptane, or tricyclo[4.3.0.1$^{2,5}$]decane, and the like. Among these, groups obtained by removing one or two hydrogen atoms from adamantane, cyclopentane, cyclohexane, and cyclooctane are preferable, and groups obtained by removing one or two hydrogen atoms from cyclopentane, cyclohexane, and cyclooctane are more preferable, since the acid-labile group exhibits a moderate dissociation capability, and the radiation-sensitive resin composition achieves an improvement in depth of focus.

Structural units respectively shown by the following formulas (a1-1) to (a1-4) (hereinafter may be referred to as "structural units (I-1) to (I-4)") are preferable as the structural unit (I). Note that the structural unit (I) may include at least one structural unit selected from the group consisting of the structural units (I-1) to (I-4).

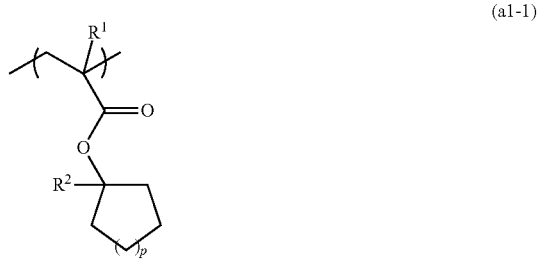

(a1-1)

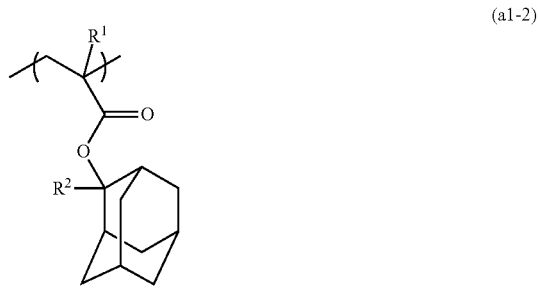

(a1-2)

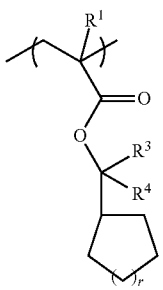
(a1-3)

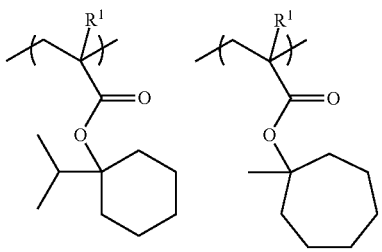

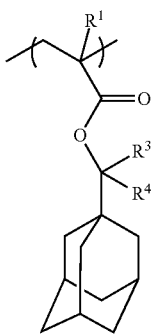
(a1-4)

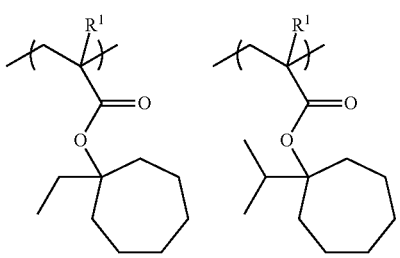

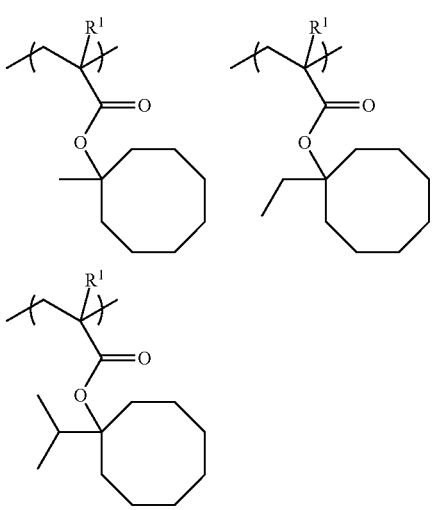

R$^1$ to R$^4$ in the formulas (a1-1) to (a1-4) are the same as defined for the formula (a1).

p in the formula (a1-1) is an integer from 0 to 4.

r in the formula (a1-3) is an integer from 0 to 4.

p is preferably an integer from 1 to 4, and more preferably 1 or 2, from the viewpoint of ease of dissociation of the acid-labile group.

r is preferably an integer from 1 to 4, and more preferably 1 or 2, from the viewpoint of ease of dissociation of the acid-labile group.

The structural unit (I-1) is preferable among the structural units (I-1) to (I-4). When the polymer (A) includes the structural unit (I-1), a resist film formed using the radiation-sensitive resin composition exhibits an improved space pattern-forming capability.

Examples of the structural unit (I-1) include structural units shown by the following formulas and the like.

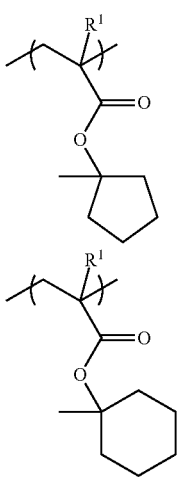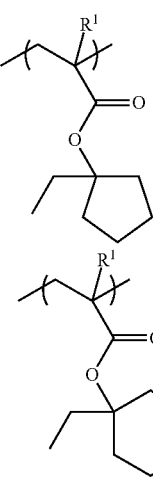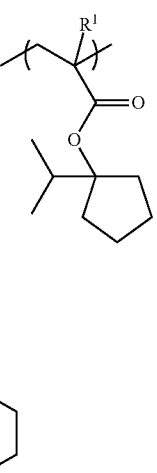

wherein R$^1$ is the same as defined for the formula (a1).

Among the above structural units, the structural unit that includes a 1-methylcyclopentyl group, a 1-ethylcyclopentyl group, or a 1-ethylcyclohexyl group as the acid-labile group is preferable.

Examples of the structural units (I-2) to (I-4) include structural units shown by the following formulas and the like.

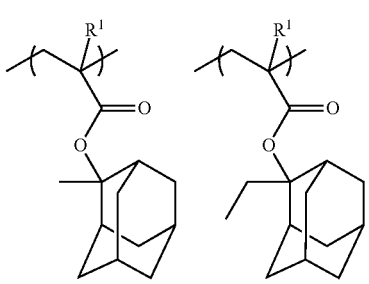

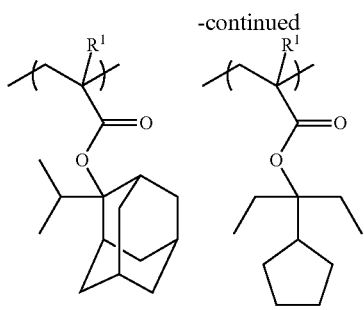

wherein $R^1$ is the same as defined for the formula (a1).

Among the above structural units, the structural unit that includes a 2-methyladamantyl group as the acid-labile group is preferable.

The content of the structural unit (I) in the polymer (A) is preferably 50 mol % or more, more preferably 52 mol % or more, more preferably 54 mol % or more, and still more preferably 56 mol % or more, based on the total structural units included in the polymer (A). The content of the structural unit (I) in the polymer (A) is preferably 80 mol % or less, more preferably 70 mol % or less, and still more preferably 65 mol % or less. When the polymer (A) includes the structural unit (I), the structural unit (II), and the structural unit (III), and the content of the structural unit (I) in the polymer (A) is 50 mol % or more, the radiation-sensitive resin composition achieves an improvement in depth of focus. When the content of the structural unit (I) is 80 mol % or less, the radiation-sensitive resin composition exhibits improved resolution. The polymer (A) may include only one type of the structural unit (I), or may include two or more types of the structural unit (I).

Structural Unit (II)

The structural unit (II) is shown by the formula (a2). When the polymer (A) includes the structural unit (II) that includes the above specific cyclic carbonate structure, the solubility of the exposed area in a developer, the space pattern-forming capability, and the defocus pattern-forming capability are improved.

$R^5$ in the formula (a2) represents a hydrogen atom or a methyl group, $R^6$ represents a single bond or a divalent hydrocarbon group having 1 to 10 carbon atoms, and A represents a trivalent organic group.

$R^5$ preferably represents a methyl group from the viewpoint of the etching resistance of a resist pattern formed using the radiation-sensitive resin composition.

Examples of the divalent hydrocarbon group having 1 to 10 carbon atoms represented by $R^6$ include a methylene group; linear alkylene groups such as an ethylene group, a trimethylene group, a tetramethylene group, a pentamethylene group, a hexamethylene group, a heptamethylene group, and an octamethylene group; branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a 1,1-propylidene group, a 1,2-propylene group, and a 2,2-propylidene group; monocyclic cycloalkylene groups having 3 to 10 carbon atoms, such as a 1,3-cyclobutylene group, a 1,3-cyclopentylene group, a 1,4-cyclohexylene group, and a1,5-cyclooctylene group; polycyclic cycloalkylene groups such as a 1,4-norbornylene group, a 2,5-norbornylene group, a 1,5-adamantylene group, and a 2,6-adamantylene group; arylene groups such as a phenylene group, a tolylene group, a naphthylene group, a phenanthrylene group, and an anthrylene group; and the like. Among these, a methylene group and linear alkylene groups are preferable, and a methylene group is more preferable.

Examples of the trivalent organic group represented by A include alkanetriyl groups such as a methanetriyl group, an ethanetriyl group, and a propanetriyl group; monocyclic cycloalkanetriyl groups such as a cyclopentanetriyl group, a cyclohexanetriyl group, and a cyclooctanetriyl group; polycyclic cycloalkanetriyl groups such as a norbornanetriyl group and an adamantanetriyl group; arenetriyl groups such as a benzenetriyl group, a toluenetriyl group, a naphthalenetriyl group, a phenanthrenetriyl group, and an anthracenetriyl group; and the like. Among these, alkanetriyl groups and monocyclic cycloalkanetriyl groups are preferable, and an ethanetriyl group and a cyclohexanetriyl group are more preferable.

Examples of the structural unit (II) include structural units shown by the following formulas (a2-1) to (a2-21) and the like.

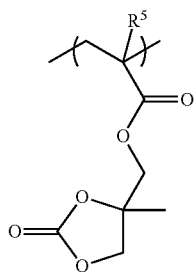 (a2-2)
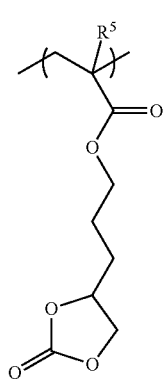 (a2-3)
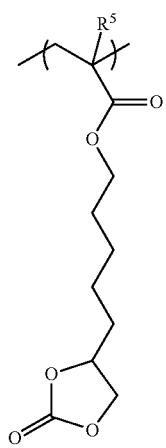 (a2-4)
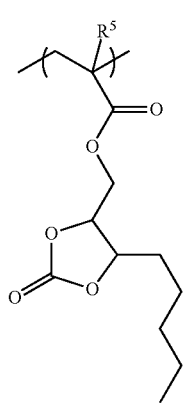 (a2-5)
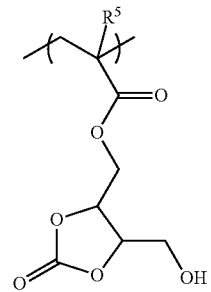 (a2-6)
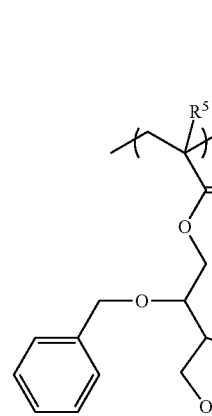 (a2-7)
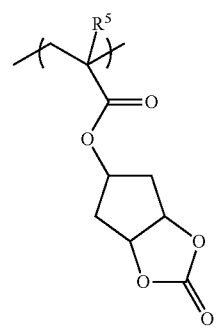 (a2-8)
(a2-9)

(a2-10)
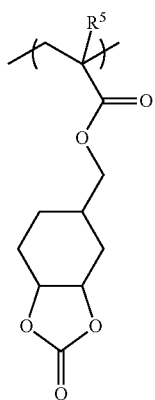
(a2-11)
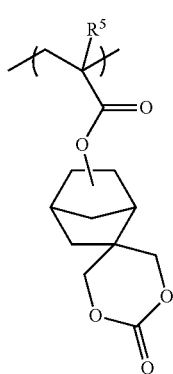
(a2-12)
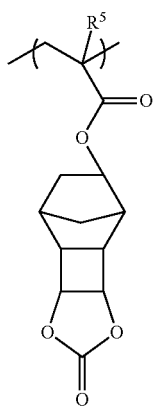
(a2-13)
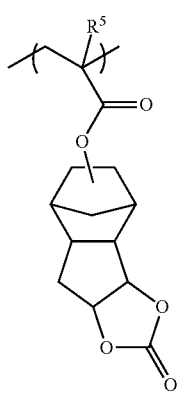
(a2-14)
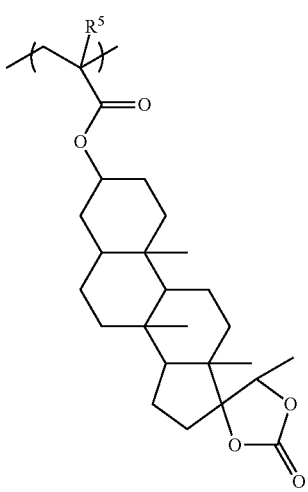
(a2-15)
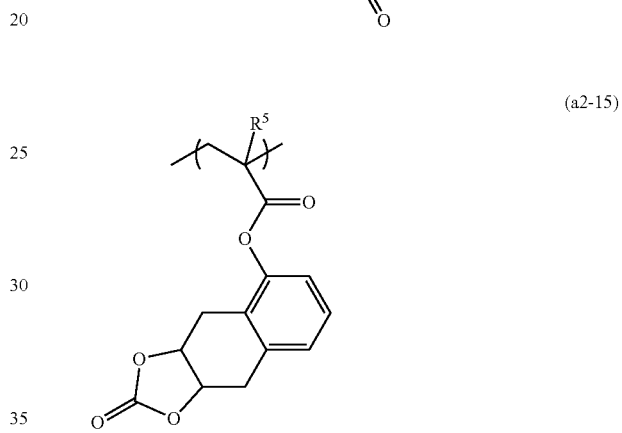
(a2-16)
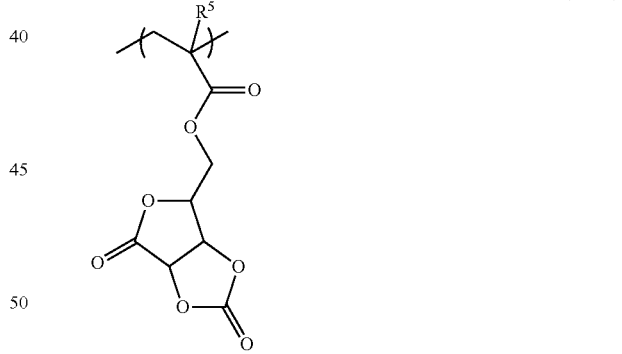
(a2-17)
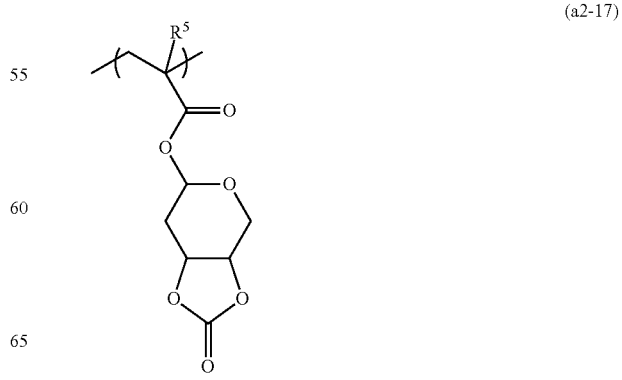

(a2-18)
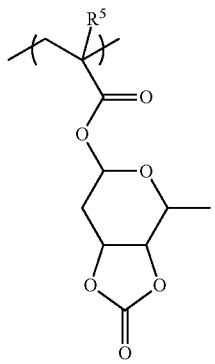

(a2-19)
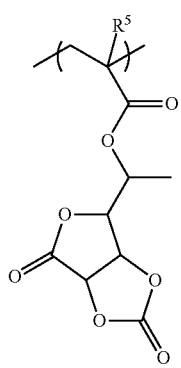

(a2-20)
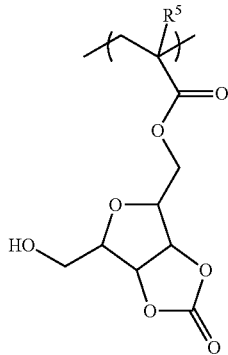

(a2-21)
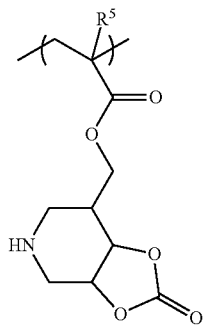

wherein $R^5$ represents a hydrogen atom or a methyl group.

Among the above structural units, the structural units shown by the formulas (a2-1) and (a2-10) are preferable.

The content of the structural unit (II) in the polymer (A) is preferably 5 to 30 mol %, and more preferably 10 to 25 mol %, based on the total structural units included in the polymer (A). When the content of the structural unit (II) in the polymer (A) is within the above range, the solubility of the exposed area in a developer, the space pattern-forming capability, and the defocus pattern-forming capability are further improved. The polymer (A) may include only one type of the structural unit (II), or may include two or more types of the structural unit (II).

Structural Unit (III)

The structural unit (III) is a lactone structure-containing structural unit. When the polymer (A) includes the structural unit (III), adhesion of the resulting resist film, and the pattern collapse resistance are improved.

Examples of the structural unit (III) include structural units shown by the following formulas (a3-1) to (a3-17) and the like.

(a3-1)
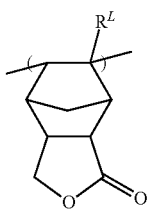

(a3-2)
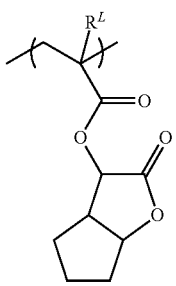

(a3-3)
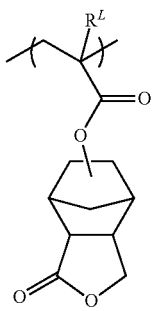

(a3-4)
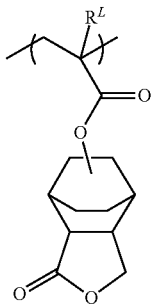

(a3-5)
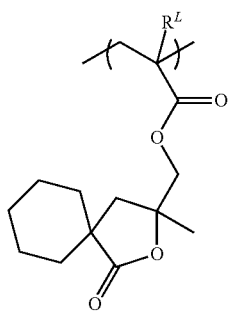
(a3-6)
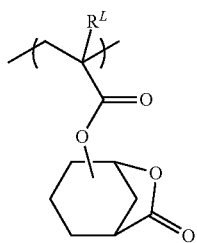
(a3-7)
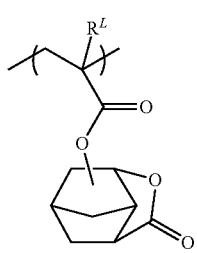
(a3-8)
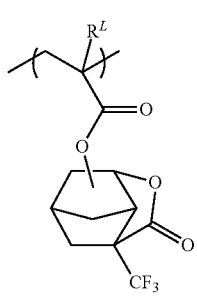
(a3-9)
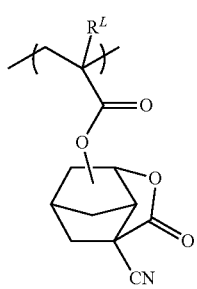
(a3-10)
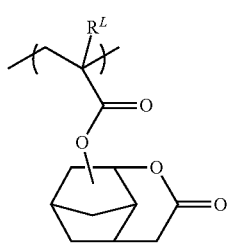
(a3-11)
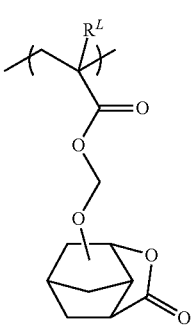
(a3-12)
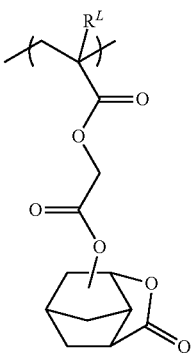
(a3-13)
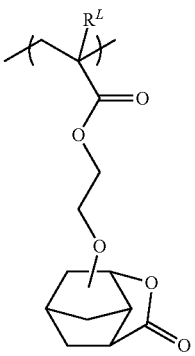
(a3-14)
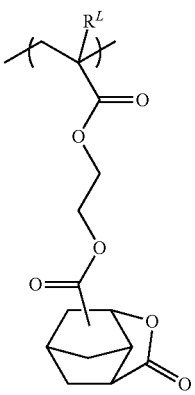

-continued

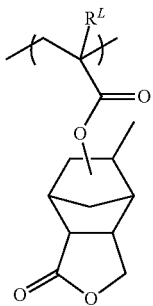
(a3-15)

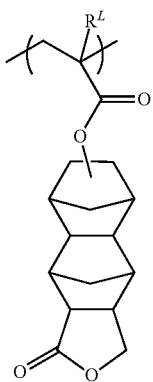
(a3-16)

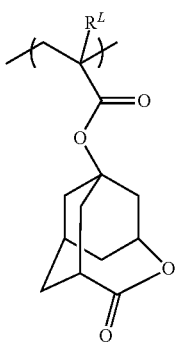
(a3-17)

wherein $R^L$ represents a hydrogen atom or a methyl group.

Among the above structural units, the structural units that include a lactone ring that is bonded to a polyalicyclic hydrocarbon group are preferable, the structural units shown by the formulas (a3-1), (a3-3), and (a3-7) that include a lactone ring that is bonded to a norbornane ring, and the structural unit shown by the formula (a3-4) that includes a lactone ring that is bonded to a bicyclo[2.2.2]octane ring are more preferable, and the structural unit shown by the formula (a3-7) is still more preferable.

Examples of a monomer compound that produces the repeating structural unit (III) include (meth)acrylates that include a polycyclic lactone ring, such as 5-oxo-4-oxa-tricyclo[4.2.1.0$^{3,7}$]non-2-yl (meth)acrylate, 9-methoxycarbonyl-5-oxo-4-oxa-tricyclo[4.2.1.0$^{3,7}$]non-2-yl (meth)acrylate, 5-oxo-4-oxatricyclo[5.2.1.0$^{3,8}$]dec-2-yl (meth)acrylate, (10-methoxycarbonyl-5-oxo-4-oxatricyclo[5.2.1.0$^{3,8}$]non-2-yl (meth)acrylate, 6-oxo-7-oxabicyclo[3.2.1]oct-2-yl (meth)acrylate, 4-methoxycarbonyl-6-oxo-7-oxabicyclo[3.2.1]oct-2-yl (meth)acrylate, 7-oxo-8-oxabicyclo[3.3.1]oct-2-yl (meth)acrylate, and 4-methoxycarbonyl-7-oxo-8-oxabicyclo[3.3.1]oct-2-yl (meth)acrylate;
(meth)acrylates that include a monocyclic lactone ring, such as 2-oxotetrahydropyran-4-yl (meth)acrylate, 4-methyl-2-oxotetrahydropyran-4-yl (meth)acrylate, 4-ethyl-2-oxotetrahydropyran-4-yl (meth)acrylate, 4-propyl-2-oxotetrahydropyran-4-yl (meth)acrylate, 5-oxotetrahydrofuran-3-yl (meth)acrylate, 2,2-dimethyl-5-oxotetrahydrofuran-3-yl (meth)acrylate, 4,4-dimethyl-5-oxotetrahydrofuran-3-yl (meth)acrylate, 2-oxotetrahydrofuran-3-yl (meth)acrylate, 4,4-dimethyl-2-oxotetrahydrofuran-3-yl (meth)acrylate, 5,5-dimethyl-2-oxotetrahydrofuran-3-yl (meth)acrylate, 5-oxotetrahydrofuran-2-ylmethyl (meth)acrylate, 3,3-dimethyl-5-oxotetrahydrofuran-2-ylmethyl (meth)acrylate, and 4,4-dimethyl-5-oxotetrahydrofuran-2-ylmethyl (meth)acrylate; and the like.

The content of the structural unit (III) in the polymer (A) is preferably 40 mol % or less based on the total structural units included in the polymer (A). When the content of the structural unit (III) in the polymer (A) is within the above range, adhesion of the resulting resist film is more appropriately adjusted, so that the resist pattern collapse resistance is further improved. As a result, the depth of focus can be further improved.

Additional Structural Unit

The polymer (A) may include an additional structural unit other than the structural unit (I), the structural unit (II), and the structural unit (III). The additional structural unit is not particularly limited. Examples of the additional structural unit include a structural unit derived from a (meth)acrylate compound that includes a substituted or unsubstituted chain-like hydrocarbon group or alicyclic hydrocarbon group. The content of the additional structural unit in the polymer (A) is normally 30 mol % or less, and more preferably 20 mol % or less, based on the total structural units included in the polymer (A).

The content of the polymer (A) in the radiation-sensitive resin composition is normally 70 mol % or more, and preferably 80 mol % or more, based on the total solid content (i.e., the total content of components other than the solvent (D)) in the radiation-sensitive resin composition. The radiation-sensitive resin composition may include only one type of the polymer (A), or may include two or more types of the polymer (A).

Synthesis of Polymer (A)

The polymer (A) may be synthesized by a known method (e.g., radical polymerization). For example, the polymer (A) may be synthesized by (1) adding a solution containing each monomer and a radical initiator dropwise to a reaction solvent or a solution containing a monomer to effect polymerization, (2) adding a solution containing each monomer and a solution containing a radical initiator dropwise to a reaction solvent or a solution containing a monomer to effect polymerization, or (3) adding a plurality of solutions respectively containing each monomer and a solution containing a radical initiator dropwise to a reaction solvent or a solution containing a monomer to effect polymerization.

The reaction (polymerization) temperature may be appropriately set depending on the type of initiator, but is preferably 30 to 180° C., more preferably 40 to 160° C., and still more preferably 50 to 140° C. The dropwise addition time of a solution containing each monomer may be appropriately set depending on the reaction temperature, the type of initiator, the type of monomer, and the like, but is preferably 30 minutes to 8 hours, more preferably 45 minutes to 6 hours, and particularly preferably 1 to 5 hours. The total reaction time including the dropwise addition time may be appropriately set, but is preferably 30 minutes to 8 hours, more preferably 45 minutes to 7 hours, and still more preferably 1 to 6 hours. When adding a solution containing a monomer dropwise to a reaction solvent or another solution, the monomer content in the solution is preferably 30 mol % or more, more preferably 50 mol % or more, and still more preferably 70 mol % or more, based on the total amount of monomers subjected to polymerization.

Examples of the radical initiator include 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis-iso-butyronitrile, 2,2'-azobis(2-methylbutyronitrile), 1,1'-azobis(cyclohexane-1-carbonitrile), 2,2'-azobis(2-methyl-N-phenylpropioneamidine)dihydrochloride, 2,2'-azobis(2-methyl-N-2-propenylpropioneamidine) dihydrochloride, 2,2'-azobis[2-(5-methyl-2-imidazolin-2-yl) propane]dihydrochloride, 2,2'-azobis[2-methyl-N-[1,1-bis (hydroxymethyl)-2-hydroxyethyl]propioneamide], dimethyl-2,2'-azobis(2-methylpropionate), 4,4'-azobis(4-cyanovaleric acid), 2,2'-azobis(2-(hydroxymethyl)propionitrile), and the like. These radical initiators may be used either alone or in combination.

An arbitrary solvent that dissolves the monomers and does not hinder polymerization (e.g., nitrobenzenes and mercapto compounds hinder polymerization) may be used as the polymerization solvent. Examples of the polymerization solvent include alcohols, ethers, ketones, amides, esters, lactones, nitriles, a mixture thereof, and the like.

Examples of the alcohols include methanol, ethanol, propanol, isopropanol, butanol, ethylene glycol, propylene glycol, ethylene glycol monomethyl ether, ethylene glycol monoethyl ether, 1-methoxy-2-propanol, and the like.

Examples of the ethers include propyl ether, isopropyl ether, butyl methyl ether, tetrahydrofuran, 1,4-dioxane, 1,3-dioxolane, 1,3-dioxane, and the like.

Examples of the ketones include acetone, methyl ethyl ketone, diethyl ketone, methyl isopropyl ketone, methyl isobutyl ketone, and the like.

Examples of the amides include N,N-dimethylformamide, N,N-dimethylacetamide, and the like.

Examples of the esters include ethyl acetate, methyl acetate, isobutyl acetate, and the like.

Examples of the lactones include γ-butyrolactone and the like.

Examples of the nitriles include acetonitrile, propionitrile, butyronitrile, and the like. These polymerization solvents may be used either alone or in combination.

It is preferable to add the polymer solution to a re-precipitation solvent after completion of polymerization to collect the target polymer as a powder. Examples of the re-precipitation solvent include water, alcohols, ethers, ketones, amides, esters, lactones, nitriles, a mixture thereof, and the like. Specific examples of the re-precipitation solvent include those mentioned above in connection with the polymerization solvent.

The weight average molecular weight (Mw) of the polymer (A) determined by gel permeation chromatography (GPC) is preferably 1000 to 100,000, more preferably 1500 to 80,000, and still more preferably 2000 to 50,000. When the Mw of the polymer (A) is within the above, the heat resistance and the developability of the resulting resist film can be improved. The ratio (Mw/Mn) of the Mw to the number average molecular weight (Mn) of the polymer (A) is preferably 1 to 5, and more preferably 1 to 3.

It is preferable that the polymer (A) used to prepare the radiation-sensitive resin composition have an impurity (e.g., halogens and metals) content as low as possible. The sensitivity, the resolution, the process stability, the pattern shape, and the like when forming a resist film are further improved by reducing the impurity content in the polymer (A). The polymer solution may be purified by a chemical purification method (e.g., washing with water or liquid-liquid extraction), a physical purification method (e.g., ultrafiltration or centrifugation), a combination of the chemical purification method and the physical purification method, or the like.

Acid Generator (B)

The radiation-sensitive resin composition includes the acid generator (B). The acid generator (B) generates an acid upon exposure to radiation. The acid-labile group included in the polymer (A) dissociates (i.e., the acidic group is deprotected) due to the acid, so that the polymer (A) present in the exposed area becomes soluble in an alkaline developer (i.e., a resist pattern can be formed). Examples of the acid generator (B) include onium salts such as sulfonium salts and iodonium salts, organic halogen compounds, sulfone compounds such as disulfones and diazomethanesulfones, and the like. Among these, onium salts are preferable. It is more preferable that the acid generator (B) include the compound shown by the formula (B1) (hereinafter may be referred to as "acid generator (B1)").

The acid generated by the acid generator (B1) is a sulfonic acid. Since the sulfonic acid has high acidity, the acid-labile group included in the polymer (A) dissociates efficiently. Since the sulfonic acid generated by the acid generator (B1) includes an alicyclic skeleton, and has 10 or more carbon atoms (i.e., has a high boiling point), the sulfonic acid does not easily volatilize during pre-baking (PB) or post-exposure bake (PEB). Moreover, since an acid diffusion phenomenon is suppressed, a moderately short acid diffusion length is achieved in the resist film. Since the acid generator (B1) and the sulfonic acid generated by the acid generator (B1) include an alicyclic skeleton, and have 10 or more carbon atoms (i.e., have a high carbon content), the acid generator (B1) and the sulfonic acid generated by the acid generator (B1) exhibit excellent mutual solubility with the polymer (A).

In the formula (B1), $R^7$ represents a monovalent hydrocarbon group having 10 or more carbon atoms that includes an alicyclic skeleton, provided that some or all of the hydrogen atoms of the hydrocarbon group may be substituted with a substituent, E represents —O—, —CO—O—*, or —O—CO—*, * indicates a site bonded to X, k is 0 or 1, X represents a divalent linear or branched alkanediyl group having 1 to 20 carbon atoms, provided that some or all of the hydrogen atoms of the alkanediyl group may be substituted with a substituent, and $M^+$ represents a monovalent onium cation.

Examples of the alicyclic skeleton included in the monovalent hydrocarbon group represented by $R^7$ include polyalicyclic skeletons such as an adamantane skeleton, a bicyclo[2.2.1]heptane skeleton, a tricyclo[4.3.0.1$^{2,5}$]decane skeleton, and a tetracyclo[4.4.0.1$^{2,5}$.1$^{7,10}$]dodecane skeleton; monoalicyclic skeletons such as a cyclopentane skeleton, a cyclohexane skeleton, a cyclooctane skeleton, a cyclodecane skeleton, and a cyclododecane skeleton; and the like. Among these, polyalicyclic skeletons are preferable, and an adamantane skeleton is more preferable, from the viewpoint of improving mutual solubility with the polymer (A).

The monovalent hydrocarbon group having 10 or more carbon atoms that includes an alicyclic skeleton represented by $R^7$ may be a group in which a carbon atom of an alicyclic skeleton having 10 or more carbon atoms is a bonding site, a group in which an alicyclic skeleton having 10 or more carbon atoms is bonded to another hydrocarbon group, or a group in which an alicyclic skeleton having 9 or less carbon atoms is bonded to another hydrocarbon group. Examples of the group in which a carbon atom of an alicyclic skeleton having 10 or more carbon atoms is a bonding site include an adamantyl group (e.g., adamantan-1-yl group and adamantan-2-yl group), a tricyclo[4.3.0.1$^{2,5}$]decanyl group, a tetracyclo [4.4.0.1$^{2,5}$.1$^{7,10}$]dodecanyl group, and the like. Examples of the group in which an alicyclic skeleton having 10 or more carbon atoms is bonded to another hydrocarbon group include an adamantylmethyl group, an adamantylethyl group, a tricyclo[4.3.0.1$^{2,5}$]decanylmethyl group, and the like. Examples of the group in which an alicyclic skeleton having 9 or less carbon atoms is bonded to another hydrocarbon group include groups that include a monoalicyclic skeleton, such as a cyclopentylpentyl group, a cyclohexylbutyl group, a cyclooctylethyl group, and a cyclooctylpropyl group; groups that include a polyalicyclic skeleton, such as a bicyclo[2.2.1]heptanylpropyl group and a bicyclo[2.2.1]heptanylbutyl group; and the like. Among these, a monovalent hydrocarbon group that includes an adamantane skeleton is preferable, an adamantyl group is more preferable, and an adamantan-1-yl group is still more preferable, from the viewpoint of improving mutual solubility with the polymer (A).

Examples of a substituent that may substitute the hydrocarbon group represented by R$^7$ include a halogen atom (e.g., fluorine atom, chlorine atom, bromine atom, and iodine atom), a hydroxyl group, a carboxyl group, an alkoxy group, an alkoxycarbonyl group, an alkoxycarbonyloxy group, an acyl group, and the like. Further examples of a substituent that may substitute the hydrocarbon group represented by R$^7$ include an oxygen atom that substitutes two hydrogen atoms bonded to an identical carbon atom of the hydrocarbon group to form a keto group.

E preferably represents —CO—O—* from the viewpoint of ease of synthesis of the acid generator (B1) and mutual solubility with the polymer (A). k is preferably 1.

Examples of the divalent alkanediyl group represented by X include linear alkanediyl groups such as a methanediyl group, a 1,2-ethanediyl group, a 1,3-propanediyl group, and a 1,4-butanediyl group; branched alkanediyl groups such as a 1,1-ethanediyl group, a 1,2-propanediyl group, a 1,2-butanediyl group, and a 1,3-butanediyl group; and the like.

Examples of a substituent that may substitute the alkanediyl group represented by X include a halogen atom (e.g., fluorine atom, chlorine atom, bromine atom, and iodine atom), a hydroxyl group, a carboxyl group, a cyano group, an alkoxy group, an alkoxycarbonyl group, an alkoxycarbonyloxy group, an acyl group, and the like.

Examples of the acid generator (B1) include the compounds shown by the following formulas and the like.

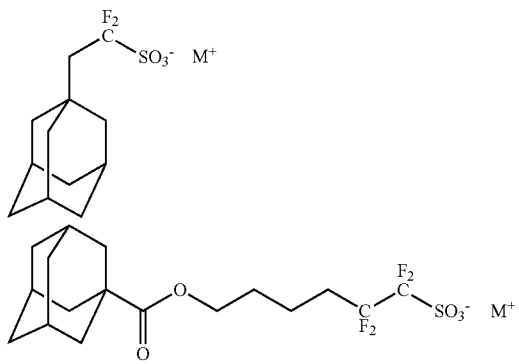

-continued

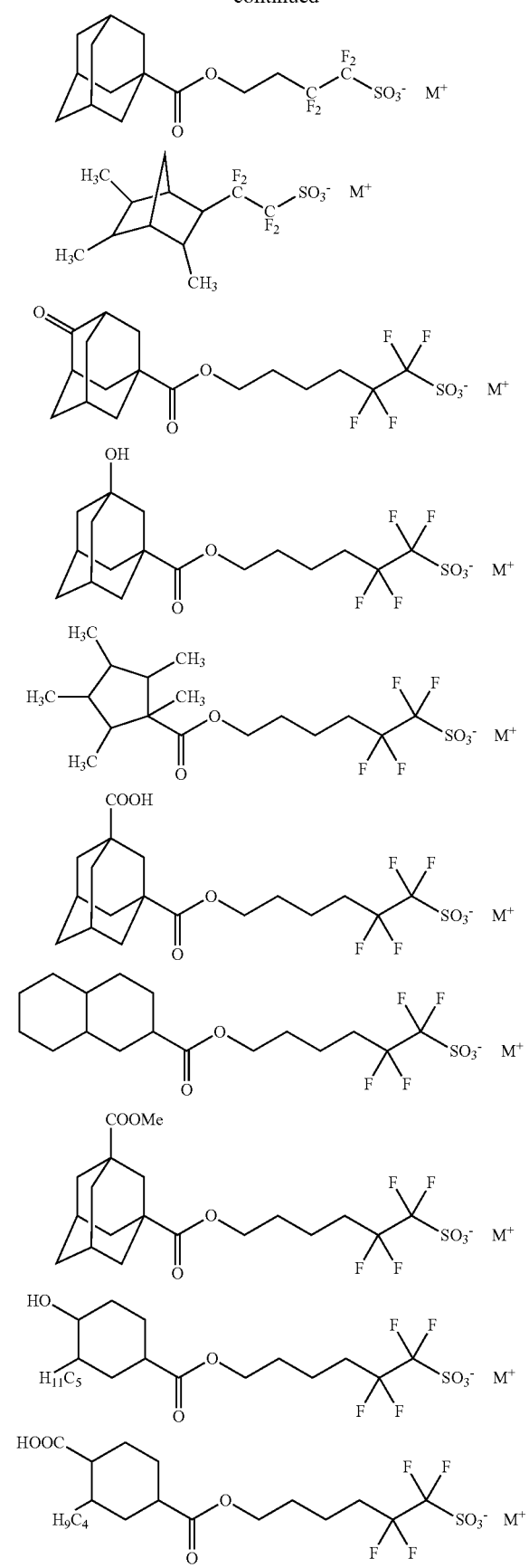

-continued

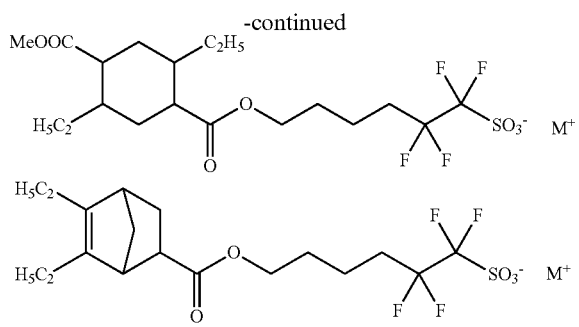

The compound shown by the formula (B1-1) (hereinafter may be referred to as "acid generator (B1-1)") is preferable as the acid generator (B1). The acid generator (B1-1) can efficiently improve the solubility of the polymer (A) in an alkaline developer, improve the sensitivity and the resolution capability of the resulting resist film, and increase the depth of focus.

In the formula (B1-1), E, p, and M⁺ are the same as defined for the formula (B1), $R^8$ represents a monovalent hydrocarbon group having 1 to 8 carbon atoms, provided that some or all of the hydrogen atoms of the hydrocarbon group may be substituted with a substituent, q is an integer from 0 to 4, provided that a plurality of $R^8$ may be either identical or different when q is an integer from 2 to 4, $R^9$ and $R^{10}$ independently represent a hydrogen atom or a monovalent hydrocarbon group having 1 to 8 carbon atoms, provided that some or all of the hydrogen atoms of the hydrocarbon group may be substituted with a substituent, m is an integer from 0 to 10, provided that a plurality of $R^9$ and a plurality of $R^{10}$ may respectively be either identical or different when m is an integer from 2 to 10, $R^{11}$ and $R^{12}$ independently represent a fluorine atom or a perfluoroalkyl group having 1 to 4 carbon atoms, and n is an integer from 1 to 4, provided that a plurality of $R^{11}$ and a plurality of $R^{12}$ may respectively be either identical or different when n is an integer from 2 to 4.

Examples of the monovalent hydrocarbon group having 1 to 8 carbon atoms represented by $R^8$ include a methyl group, an ethyl group, an n-propyl group, an i-propyl group, an n-butyl group, an i-butyl group, a sec-butyl group, a t-butyl group, an n-pentyl group, an n-hexyl group, an n-heptyl group, an n-octyl group, and the like. Among these, a methyl group and an ethyl group are preferable.

Examples of a substituent that may substitute the monovalent hydrocarbon group having 1 to 8 carbon atoms represented by $R^8$ include a halogen atom (e.g., fluorine atom, chlorine atom, bromine atom, and iodine atom), a hydroxyl group, a carboxyl group, a cyano group, an alkoxy group, an alkoxycarbonyl group, an alkoxycarbonyloxy group, an acyl group, and the like. Further examples of a substituent that may substitute the monovalent hydrocarbon group having 1 to 8 carbon atoms represented by $R^8$ include an oxygen atom that substitutes two hydrogen atoms bonded to an identical carbon atom of the hydrocarbon group to form a keto group.

Note that the monovalent hydrocarbon group represented by $R^8$ may be bonded to an arbitrary carbon atom of the adamantane skeleton. Specifically, the monovalent hydrocarbon group represented by $R^8$ may be bonded to a plurality of carbon atoms of an identical ring among a plurality of rings included in the adamantane skeleton, or may be bonded to a plurality of carbon atoms of a plurality of rings included in the adamantane skeleton. Two groups represented by $R^8$ may be bonded to the secondary carbon atom included in the adamantane skeleton.

q is preferably an integer from 0 to 3, more preferably an integer from 0 to 2, still more preferably 0 or 1, and particularly preferably 0.

Examples of the monovalent hydrocarbon group having 1 to 8 carbon atoms represented by $R^9$ and $R^{10}$ include those mentioned above in connection with the monovalent hydrocarbon group having 1 to 8 carbon atoms represented by $R^8$. $R^9$ and $R^{10}$ preferably represent a hydrogen atom, a methyl group, or an ethyl group.

m is preferably an integer from 0 to 8, more preferably an integer from 0 to 6, and still more preferably an integer from 1 to 4.

Examples of the perfluoroalkyl group having 1 to 4 carbon atoms represented by $R^{11}$ and $R^{12}$ include a trifluoromethyl group, a pentafluoroethyl group, a heptafluoro-n-propyl group, a heptafluoro-i-propyl group, a nonafluoro-n-butyl group, a nonafluoro-i-butyl group, a nonafluoro-sec-butyl group, a nonafluoro-t-butyl group, and the like.

n is an integer from 1 to 4. Therefore, since the sulfonic acid generated by the acid generator (B1-1) has a strong fluorine-containing electron-attracting group at the α-position carbon atom of the sulfonate group, the acidity of the sulfonic acid generated by the acid generator (B1-1) can be improved. n is preferably an integer from 1 to 3, and more preferably 1 or 2.

The monovalent onium cation represented by M⁺ is described below.

Examples of the monovalent onium cation represented by M⁺ in the formulas (B1) and (B1-1) include onium cations that include oxygen (O), sulfur (S), selenium (Se), nitrogen (N), phosphorus (P), arsenic (As), antimony (Sb), chlorine (Cl), boron (Br), iodine (I), or the like. The monovalent onium cation represented by M⁺ is preferably at least one cation selected from the group consisting of the cation (sulfonium cation) shown by the formula (b1) and the cation (iodonium cation) shown by the formula (b2).

$R^{13}$, $R^{14}$, and $R^{15}$ in the formula (b1) independently represent a linear or branched alkyl group having 1 to 10 carbon atoms or an aryl group having 6 to 18 carbon atoms, provided that some or all of the hydrogen atoms of the alkyl group or the aryl group may be substituted with a substituent, and $R^{14}$ and $R^{15}$ may bond to each other to form a cyclic structure together with the sulfur atom bonded to $R^{14}$ and $R^{15}$.

$R^{16}$ and $R^{17}$ in the formula (b2) independently represent a linear or branched alkyl group having 1 to 10 carbon atoms or an aryl group having 6 to 18 carbon atoms, provided that some or all of the hydrogen atoms of the alkyl group or the aryl group may be substituted with a substituent, and $R^{16}$ and $R^{17}$ may bond to each other to form a cyclic structure together with the iodine atom bonded to $R^{16}$ and $R^{17}$.

Examples of the linear or branched alkyl group having 1 to 10 carbon atoms represented by $R^{13}$, $R^{14}$, $R^{15}$, $R^{16}$, and $R^{17}$ include a methyl group, an ethyl group, an n-propyl group, an i-propyl group, an n-butyl group, an i-butyl group, a sec-butyl group, a t-butyl group, and the like.

Examples of the aryl group having 6 to 18 carbon atoms represented by $R^{13}$, $R^{14}$, $R^{15}$, $R^{16}$, and $R^{17}$ include a phenyl group, a naphthyl group, an anthranyl group, a phenanthryl group, and the like.

Examples of a substituent that may substitute the alkyl group or the aryl group include a halogen atom (e.g., fluorine atom, chlorine atom, bromine atom, and iodine atom), a hydroxyl group, a carboxyl group, a cyano group, an alkyl group, a cycloalkyl group, an alkoxy group, a cycloalkyloxy group, an alkoxycarbonyl group, an alkoxycarbonyloxy group, an acyl group, and the like.

$R^{13}$, $R^{14}$, $R^{15}$, $R^{16}$, and $R^{17}$ preferably represent an aryl group, and more preferably a phenyl group, from the viewpoint of high radiation absorption efficiency.

Sulfonium cations shown by the following formulas (b1-a) and (b1-b) are preferable as the sulfonium cation shown by the formula (b1) from the viewpoint of high radiation absorption efficiency.

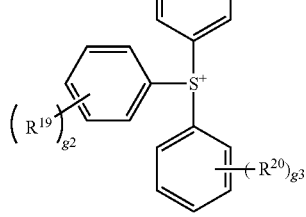

(b1-a)

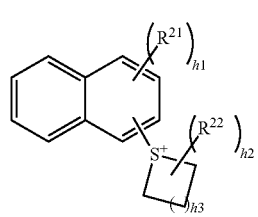

(b1-b)

In the formula (b1-a), $R^{18}$, $R^{19}$, and $R^{20}$ independently represent a hydroxyl group, a linear or branched alkyl group having 1 to 12 carbon atoms, or an aryl group having 6 to 12 carbon atoms, provided that some or all of the hydrogen atoms of the alkyl group or the aryl group may be substituted with a substituent, and g1, g2, and g3 are independently an integer from 0 to 5, provided that a plurality of $R^{18}$ may be either identical or different when g1 is an integer from 2 to 5, a plurality of $R^{19}$ may be either identical or different when g2 is an integer from 2 to 5, and a plurality of $R^{20}$ may be either identical or different when g3 is an integer from 2 to 5.

In the formula (b1-b), $R^{21}$ represents a hydroxyl group, a linear or branched alkyl group having 1 to 8 carbon atoms, or an aryl group having 6 to 8 carbon atoms, provided that some or all of the hydrogen atoms of the alkyl group or the aryl group may be substituted with a substituent, h1 is an integer from 0 to 7, $R^{22}$ represents a hydrogen atom, a linear or branched alkyl group having 1 to 7 carbon atoms, or an aryl group having 6 or 7 carbon atoms, provided that some or all of the hydrogen atoms of the alkyl group or the aryl group may be substituted with a substituent, h2 is an integer from 0 to 6, and h3 is an integer from 0 to 3, provided that a plurality of $R^{21}$ may be either identical or different when h1 is an integer from 2 to 7, a plurality of $R^{22}$ may be either identical or different when h2 is an integer from 2 to 6, and two $R^{22}$ among a plurality of $R^{22}$ may bond to each other to form a cyclic structure when h2 is an integer from 2 to 6.

Specific examples of the sulfonium cation shown by the formula (b1) include the sulfonium cations shown by the following formulas (b1-1) and (b1-63) and the like.

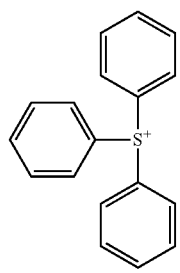

(b1-1)

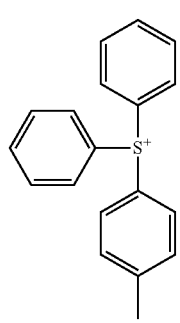

(b1-2)

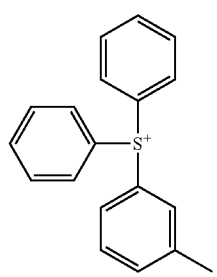

(b1-3)

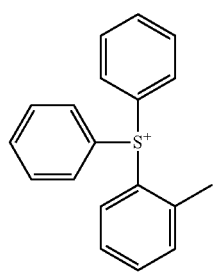

(b1-4)

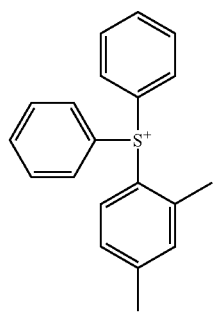

(b1-5)

(b1-6)
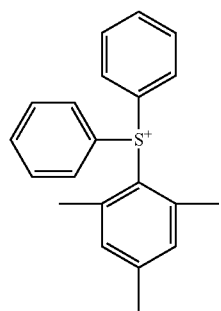
(b1-7)
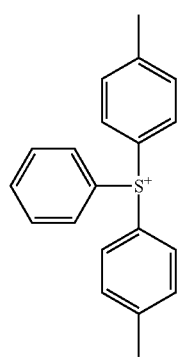
(b1-8)
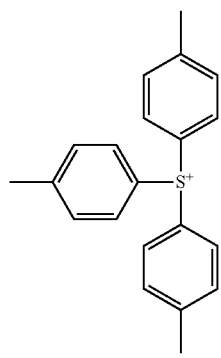
(b1-9)
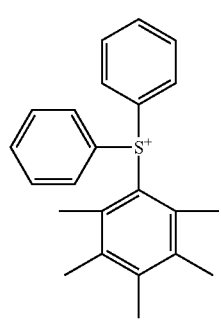
(b1-10)
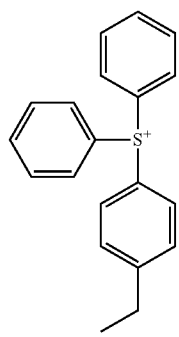
(b1-11)
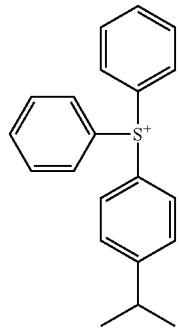
(b1-12)
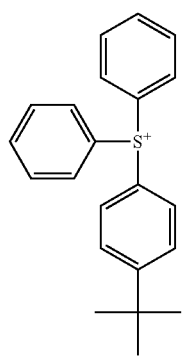
(b1-13)
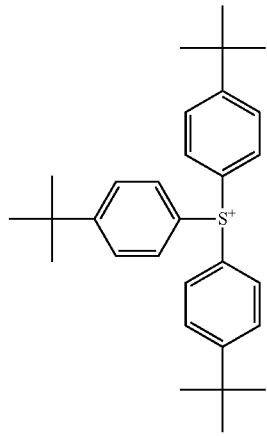

(b1-14)
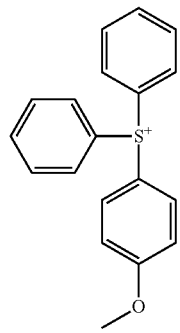
(b1-15)
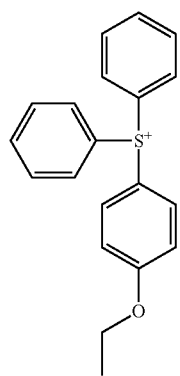
(b1-16)
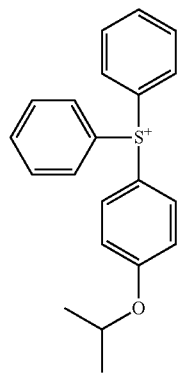
(b1-17)
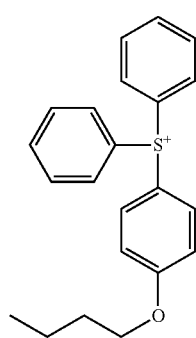
(b1-18)
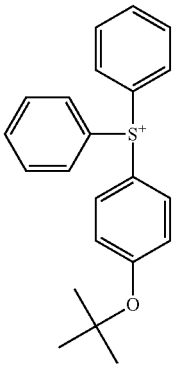
(b1-19)
(b1-20)
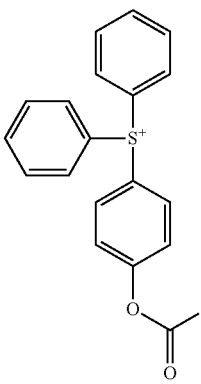
(b1-21)
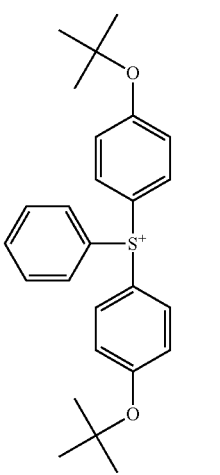

(b1-22)
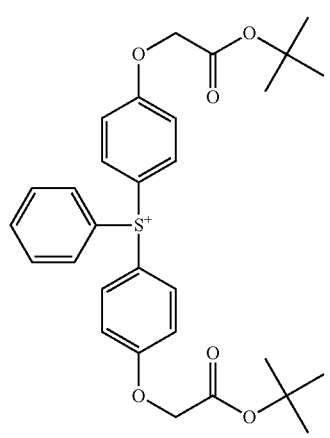
(b1-25)
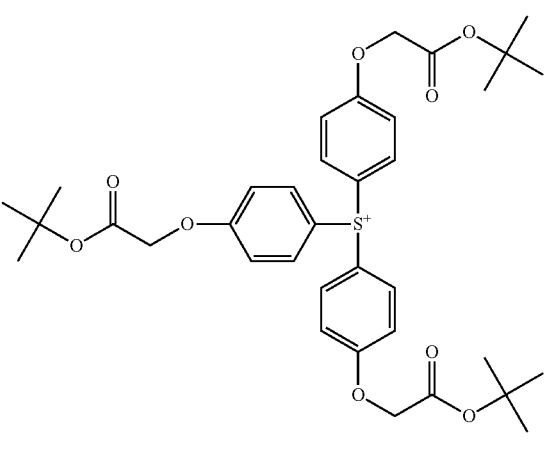
(b1-23)
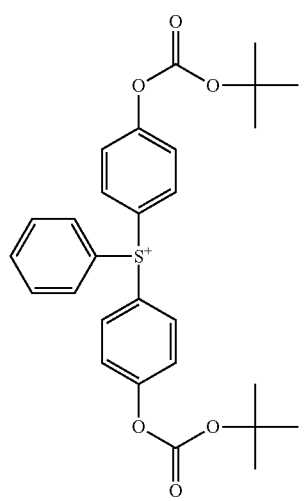
(b1-26)
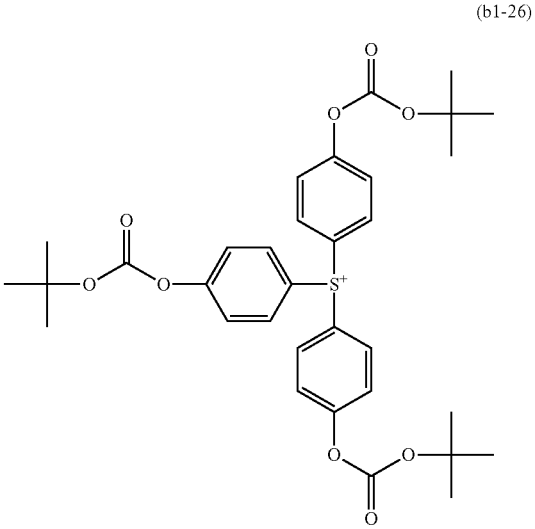
(b1-24)
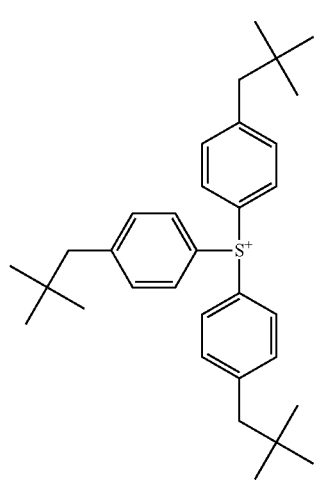
(b1-27)
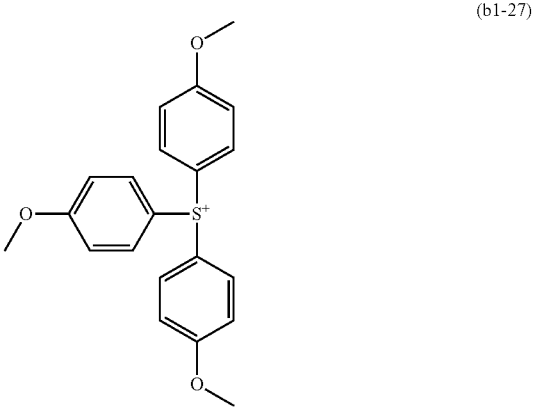

(b1-28)
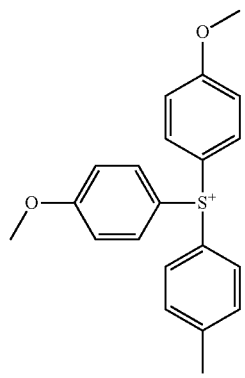
(b1-29)
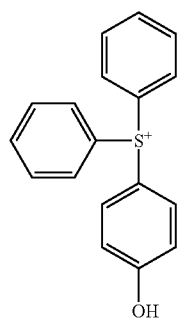
(b1-30)
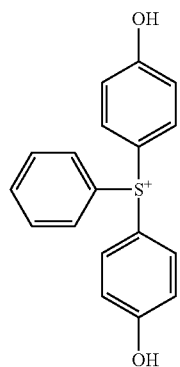
(b1-31)
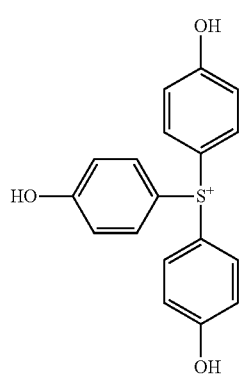
(b1-32)
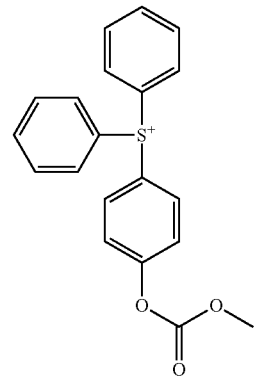
(b1-33)
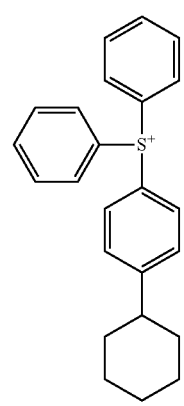
(b1-34)
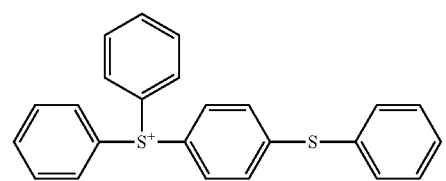
(b1-35)
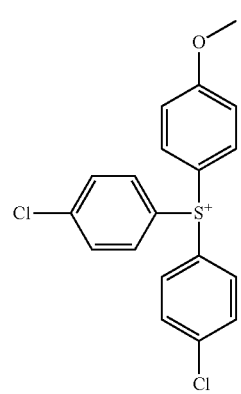
(b1-36)
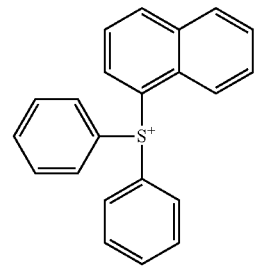

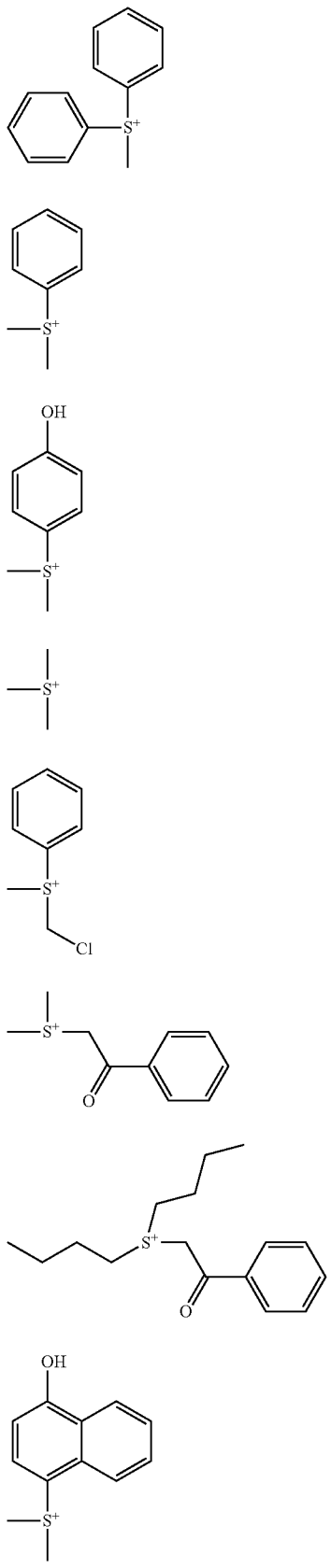
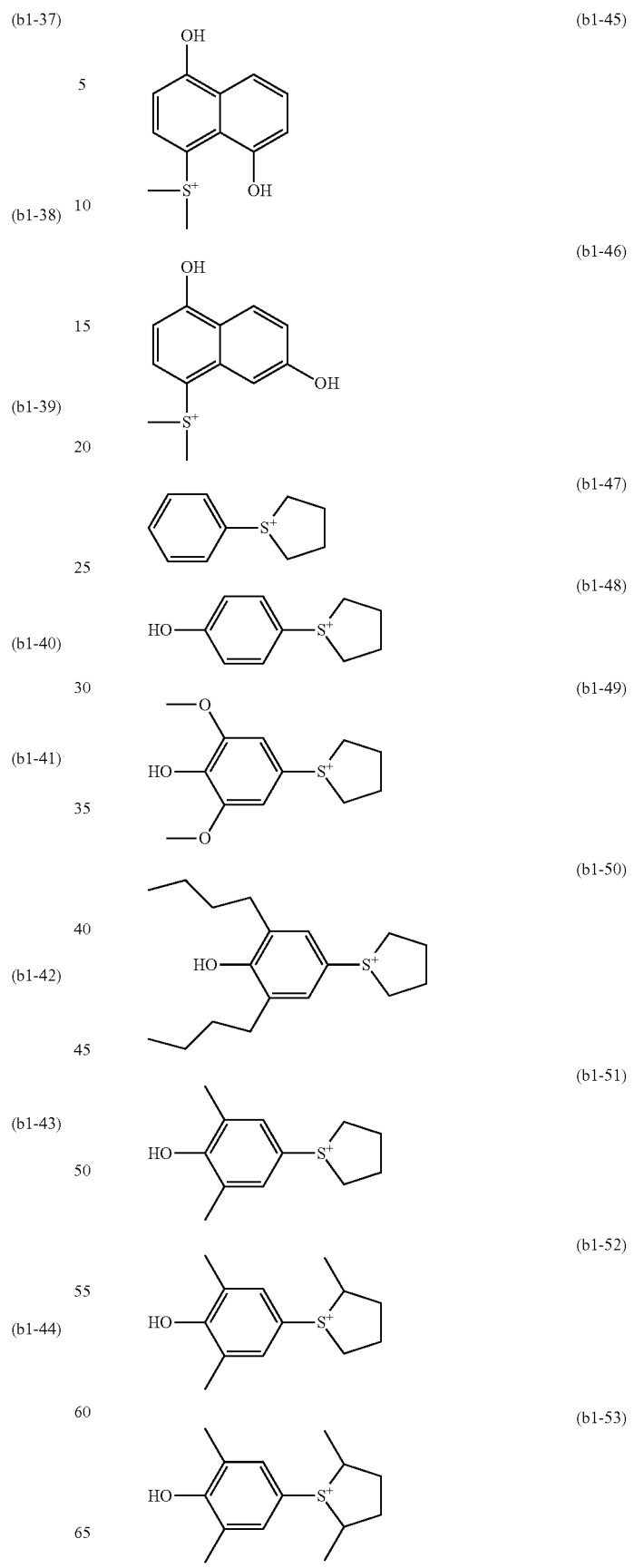

(b1-54) 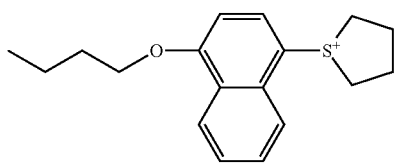

(b1-55) 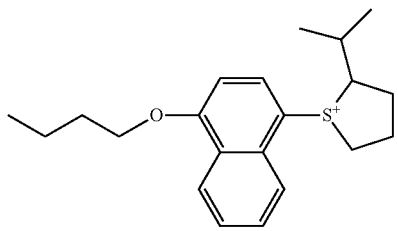

(b1-56) 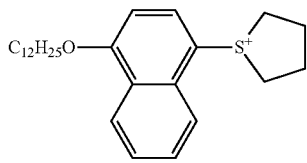

(b1-57) 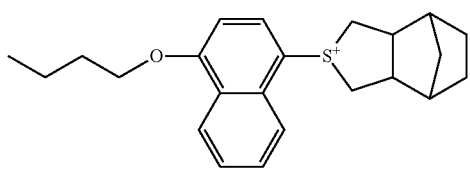

(b1-58) 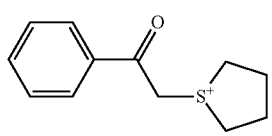

(b1-59) 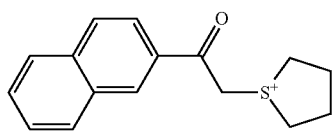

(b1-60) 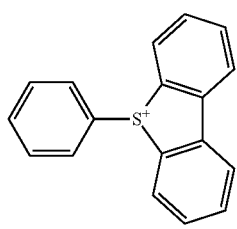

(b1-61) 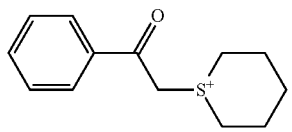

(b1-62) 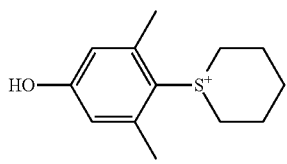

(b1-63)

![](b1-63 structure: HO-dimethylphenyl-S+-cyclohexyl)

Among these, the sulfonium cations shown by the formulas (b1-1), (b1-2), (b1-6), (b1-8), (b1-13), (b1-19), (b1-25), (b1-27), (b1-29), (b1-33), (b1-51), and (b1-54) are preferable.

An iodonium cation shown by the following formula (b2-a) is preferable as the iodonium cation shown by the formula (b2) from the viewpoint of high radiation absorption efficiency.

(b2-a)

$$\left(R^{23}\right)_{i1}\!\!-\!\!\diagup\!\!-\!\!I^+\!\!-\!\!\diagup\!\!-\!\!\left(R^{24}\right)_{i2}$$

In the formula (b2-a), $R^{23}$ and $R^{24}$ independently represent a hydroxyl group, a linear or branched alkyl group having 1 to 12 carbon atoms, or an aryl group having 6 to 12 carbon atoms, provided that some or all of the hydrogen atoms of the alkyl group or the aryl group may be substituted with a substituent, and i1 to i2 are independently an integer from 0 to 5, provided that a plurality of $R^{23}$ may be either identical or different when i1 is an integer from 2 to 5, a plurality of $R^{24}$ may be either identical or different when i2 is an integer from 2 to 5, and the two aryl groups bonded to the iodine atom may bond to each other to form a cyclic structure together with the iodine atom.

Specific examples of the iodonium cation shown by the formula (b2) include the iodonium cations shown by the following formulas (b2-1) and (b2-39) and the like.

(b2-1)

(b2-2)

(b2-3)

(b2-4)

(b2-5)

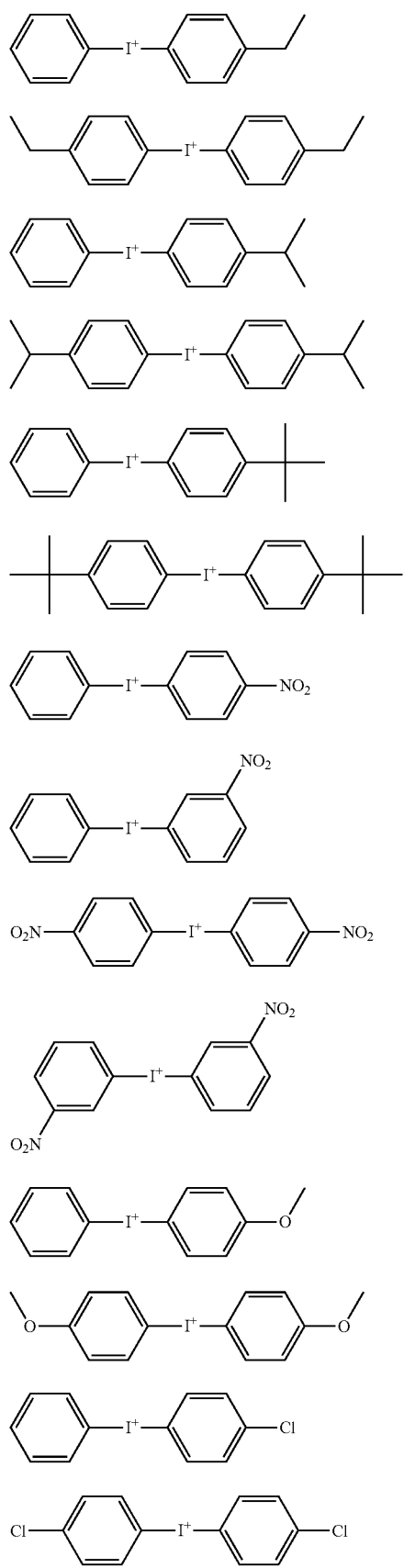
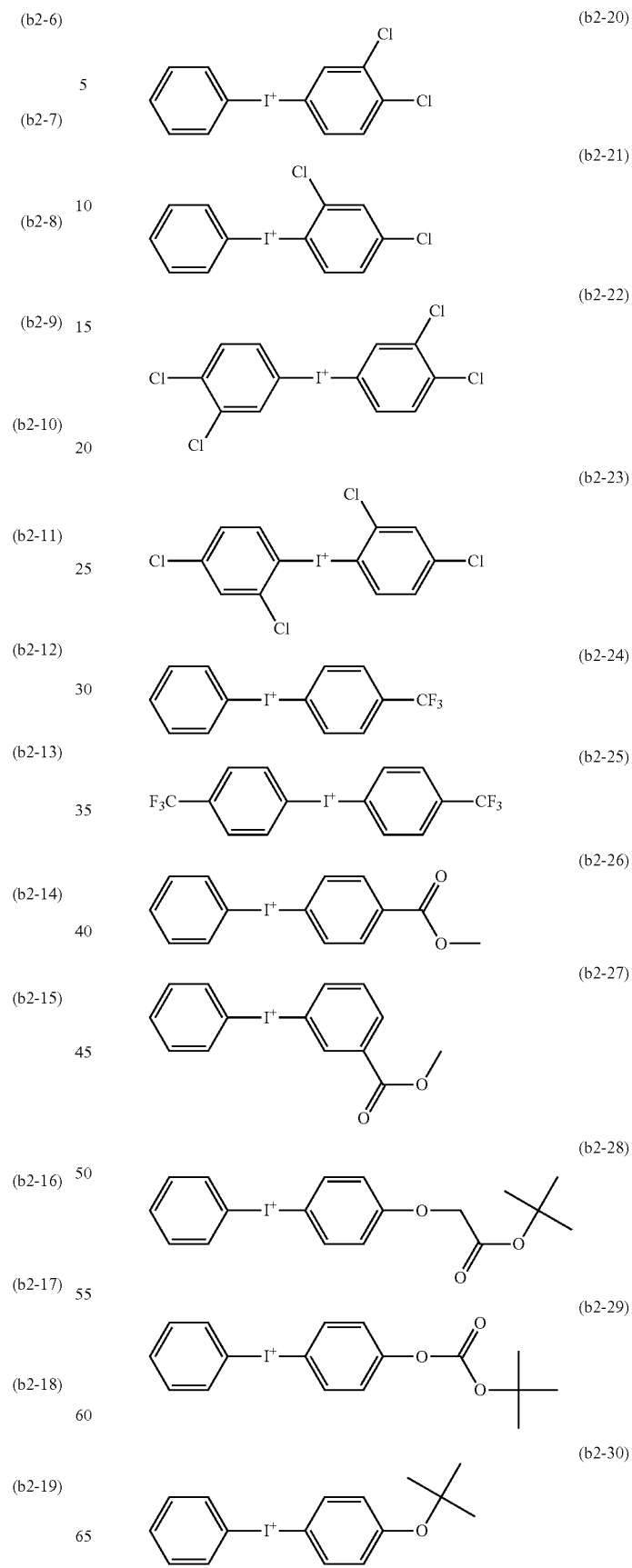

(b2-31)
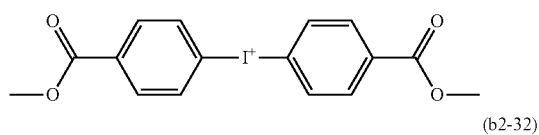

(b2-32)
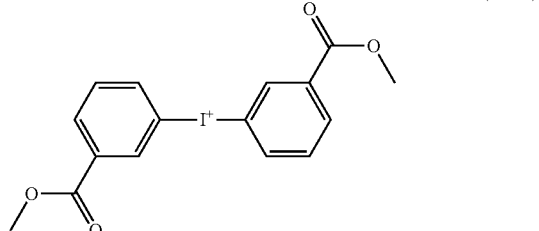

(b2-33)

(b2-34)
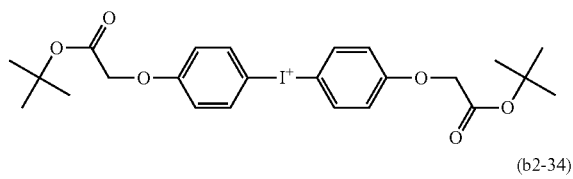

(b2-35)
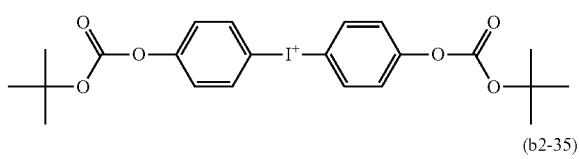

(b2-36)
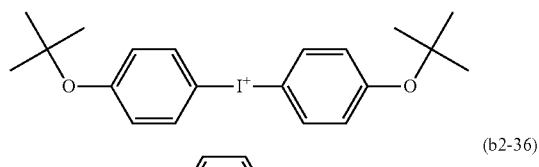

(b2-37)
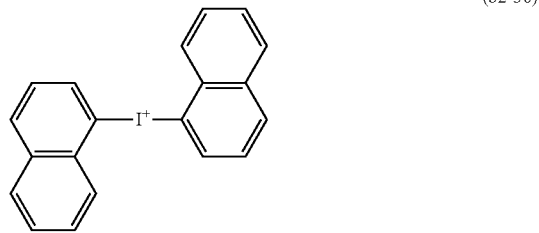

(b2-38)
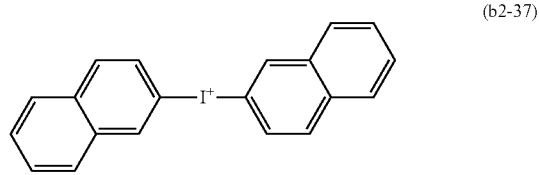

(b2-39)
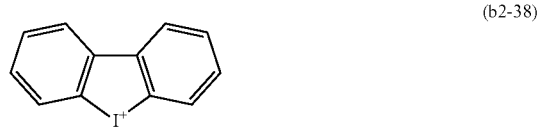

Among these, the iodonium cations shown by the formulas (b2-1) and (b2-11) are preferable.

The onium cation represented by $M^+$ may be synthesized by the method described in Advances in Polymer Science, Vol. 62, pp. 1-48 (1984), for example.

The acid generator (B) is used in an arbitrary amount depending on the type of the acid generator (B). The acid generator (B) is preferably used in an amount of 0.1 to 20 parts by mass, more preferably 0.1 to 15 parts by mass, and still more preferably 0.2 to 12 parts by mass, based on 100 parts by mass of the polymer (A). When the acid generator (B) is used in an amount within the above range, a moderate amount of sulfonic acid is generated, so that the resolution is further improved. Moreover, the resulting resist film exhibits sufficient transparency to radiation, heat resistance, and the like, so that a good pattern shape can be obtained.

Acid Diffusion Controller (C)

The radiation-sensitive resin composition may preferably include the acid diffusion controller (C). The acid diffusion controller (D) controls a phenomenon in which the acid generated by the acid generator upon exposure to radiation is diffused in the resist film, and suppresses side reactions (i.e., the acid causes dissociation of the acid-labile group included in the polymer (A) in the unexposed area). The acid diffusion controller (C) further improves the resolution of the resulting resist film, and suppresses a change in line width of the resulting resist pattern due to a change in post-exposure delay (PED) from exposure to heat treatment, so that a radiation-sensitive resin composition that exhibits excellent process stability and storage stability can be obtained.

Examples of the acid diffusion controller (C) include N-t-butoxycarbonyl group-containing amino compounds such as N-t-butoxycarbonyl-di-n-octylamine, N-t-butoxycarbonyl-di-n-nonylamine, N-t-butoxycarbonyl-di-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N,N'-di-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole, and the like.

Further examples of the acid diffusion controller (C) include tertiary amine compounds, quaternary ammonium hydroxide compounds, nitrogen-containing heterocyclic compounds, and the like.

Examples of the tertiary amine compounds include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline; alkanolamines such as triethanolamine and N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzenetetramethylenediamine, bis(2-dimethylaminoethyl) ether, bis(2-diethylaminoethyl)ether, and the like.

Examples of the quaternary ammonium hydroxide compounds include tetra-n-propylammonium hydroxide, tetra-n-butylammonium hydroxide, and the like.

Examples of the nitrogen-containing heterocyclic compounds include pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine, piperazines such as piperazine and 1-(2-hydroxyethyl)piperazine, pyrazine, pyrazole, pyridazine, quinoxaline, purine, pyrrolidine, piperidine, 3-piperidino-1,2-propanediol, morpholine, 4-methylmorpholine, 1,4-dimethylpiperazine, 1,4-diazabicyclo[2.2.2]octane, imidazole, 4-methylimidazole, 1-benzyl-2-methylimidazole, 4-methyl-2-phenylimidazole, benzimidazole, 2-phenylbenzimidazole, and the like. These acid diffusion controllers (C) may be used either alone or in combination.

The acid diffusion controller (C) is preferably used in an amount of 10 parts by mass or less, and more preferably 0.001 to 5 parts by mass, based on 100 parts by mass of the polymer (A), in order to ensure that the resulting resist film exhibits high sensitivity.

Solvent (D)

The radiation-sensitive resin composition normally includes the solvent (D). Examples of the solvent (D) include ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

lactates such as methyl lactate, ethyl lactate, n-propyl lactate, and i-propyl lactate; formates such as n-amyl formate and i-amyl formate; acetates such as ethyl acetate, n-propyl acetate, i-propyl acetate, n-butyl acetate, i-butyl acetate, n-amyl acetate, i-amyl acetate, 3-methoxybutyl acetate, and 3-methyl-3-methoxybutyl acetate; propionates such as i-propyl propionate, n-butyl propionate, i-butyl propionate, and 3-methyl-3-methoxybutyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methyl-3-methoxybutyl butyrate, methyl acetoacetate, ethyl acetoacetate, methyl pyruvate, and ethyl pyruvate; aromatic hydrocarbons such as toluene and xylene;

ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; lactones such as γ-butyrolactone; and the like. These solvents (D) may be used either alone or in combination.

Additional Optional Component

The radiation-sensitive resin composition may further include an acid-labile group-containing alicyclic additive, a surfactant, a sensitizer, an alkali-soluble resin, a halation inhibitor, a preservative, an antifoaming agent, or the like as an additional optional component.

The acid-labile group-containing alicyclic additive further improve the dry etching resistance, the pattern shape, adhesion to a substrate, and the like. Examples of the alicyclic additive include adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like. These alicyclic additives may be used either alone or in combination.

The surfactant improves applicability, striation resistance, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, and the like. Examples of a commercially available surfactant include KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either alone or in combination.

Preparation of Radiation-sensitive Resin Composition

The radiation-sensitive resin composition may be prepared by dissolving the polymer (A), the acid generator (B), and additional optional components such as the acid diffusion controller (C) in the solvent (D) so that the total solid content is 3 to 50 mass % (preferably 5 to 25 mass %), and filtering the solution through a filter having a pore size of about 200 nm.

Resist Pattern-forming Method

A resist pattern-forming method that utilizes the radiation-sensitive resin composition is described below.

The resist pattern-forming method includes (1) applying the radiation-sensitive resin composition to a substrate to form a resist film (hereinafter may be referred to as "step (1)"), (2) applying radiation to at least part of the resist film (hereinafter may be referred to as "step (2)"), and (3) developing the resist film to which the radiation has been applied (hereinafter may be referred to as "step (3)"). Each step is described below.

In the step (1), the radiation-sensitive resin composition is applied to the substrate to form a resist film. A silicon wafer, an aluminum-coated wafer, or the like may be used as the substrate. The radiation-sensitive resin composition may be applied by spin coating, cast coating, roll coating, or the like.

In order to maximize the potential of the radiation-sensitive resin composition, an organic or inorganic antireflective film may be formed on the substrate (see Japanese Examined Patent Publication (KOKOKU) No. 6-12452, for example). A protective film disclosed in Japanese Patent Application Publication (KOKAI) No. 5-188598 or the like may be formed on the resist layer in order to prevent the effects of basic impurities and the like contained in the environmental atmosphere. Note that these techniques may be used in combination. The resist film is optionally pre-baked (PB).

In the step (2), radiation is applied to at least part of the resist film. More specifically, the resist film is exposed via a mask that is designed to form a given resist pattern.

Radiation used for exposure may be appropriately selected from visible rays, ultraviolet rays, deep ultraviolet rays, X-rays, charged particle rays, and the like. It is preferable to use deep ultraviolet rays such as ArF excimer laser light (wavelength: 193 nm) and KrF excimer laser light (wavelength: 248 nm), and it is particularly preferable to use ArF excimer laser light (wavelength: 193 nm).

It is preferable to perform post-exposure bake (PEB) after exposure. PEB ensures that the acid-labile group included in the resist film dissociates smoothly. The PEB temperature may be determined depending on the composition of the radiation-sensitive resin composition, but is preferably 30 to 200° C., and more preferably 50 to 170° C.

In the step (3), the resist film to which the radiation has been applied is developed. An alkaline aqueous solution prepared by dissolving at least one alkaline compound selected from the group consisting of sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene in water is preferable as a developer used for development. The concentration of the alkaline aqueous solution is preferably 10 mass % or less. When the concentration of the alkaline aqueous solution is 10 mass % or less, it is possible to prevent dissolution of the unexposed area in the developer to form a resist pattern having a good shape.

An organic solvent may be added to the developer, for example. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone, alcohols such as methanol, ethanol, n-propyl alcohol, i-propyl alcohol, n-butyl alcohol, t-butyl alcohol, cyclopentanol, cyclohexanol, 1,4-hexanediol, and 1,4-hexanedimethylol, ethers such as tetrahydrofuran and dioxane, esters such as ethyl acetate, n-butyl acetate, and i-amyl acetate, aromatic hydrocarbons such as toluene and xylene, phenol, acetonylacetone, dimethylformamide, and the like. These organic solvents may be used either alone or in combination.

The organic solvent is preferably used in an amount of 100 parts by volume or less based on 100 parts by volume of the alkaline aqueous solution. If the amount of the organic solvent is 100 parts by volume or less, a situation in which the exposed area remains undeveloped can be prevented due to sufficient developability. An appropriate amount of a surfactant or the like (e.g., the surfactant mentioned above in connection with the radiation-sensitive resin composition) may also be added to the developer. The resist film is preferably rinsed with water, and dried after development using the developer. A positive-tone resist pattern can thus be formed.

EXAMPLES

The invention is further described below by way of examples and comparative examples. Note that the invention is not limited to the following examples. The property values were measured by the following methods.

Weight Average Molecular Weight (Mw) and Number Average Molecular Weight (Mn)

The weight average molecular weight (Mw) and the number average molecular weight (Mn) of the polymer (A) were determined by gel permeation chromatography (GPC) (standard: monodisperse polystyrene) using GPC columns manufactured by Tosoh Corporation (G2000HXL×2, G3000HXL×1, G4000HXL×1) (flow rate: 1.0 ml/min, column temperature: 40° C., eluant: tetrahydrofuran). The dispersity (Mw/Mn) was calculated from the measurement results.

$^{13}$C-NMR Analysis

The polymer (A) was subjected to $^{13}$C-NMR analysis using a mass spectrometer "JNM-EX400" (manufactured by JEOL Ltd.). Deuterated chloroform was used as the measurement solvent. The content of each structural unit in the polymer (A) was calculated as an average value from the area ratio of the peak corresponding to each structural unit in the $^{13}$C-NMR spectrum.

Synthesis of Polymer (A)

The following monomer compounds were used to synthesize the polymer (A).

(M-1)

(M-2)

(M-3)

-continued

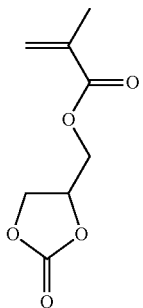

(M-4)

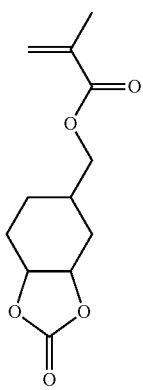

(M-5)

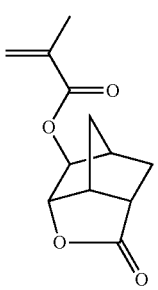

(M-6)

Synthesis Example 1

A monomer solution was prepared by dissolving 27.64 g (60.0 mol %) of the compound (M-1), 10.20 g (20.0 mol %) of the compound (M-5), and 12.17 g (20.0 mol %) of the compound (M-7) in 100 g of 2-butanone, and adding 2.25 g of azobisisobutylonitrile to the solution.

A three-necked flask (500 ml) charged with 50 g of 2-butanone was purged with nitrogen for 30 minutes. The flask was then heated to 80° C. with stirring, and the monomer solution was added dropwise to the flask using a dropping funnel over 3 hours. The monomers were polymerized for 6 hours from the start of addition of the monomer solution to obtain a polymer solution. After completion of polymerization, the polymer solution was cooled with water to 30° C. or less, and added to 1000 g of methanol to precipitate a white substance. The white substance was filtered off, and washed twice with 200 g of methanol. The white substance was filtered off again, and dried at 50° C. for 17 hours to obtain a white powdery polymer (A-1) (35 g, yield: 70%).

The polymer (A-1) had a weight average molecular weight (Mw) of 7200 and a dispersity (Mw/Mn) of 1.40. The ratio (mol %) of repeating units derived from the compounds (M-1), (M-5), and (M-7) determined by $^{13}$C-NMR analysis was 57.5:20.5:22.0.

Synthesis Examples 2 to 11

Polymers (A-2) to (A-8) and (a-1) to (a-3) were synthesized in the same manner as in Synthesis Example 1, except that the type and the amount of the monomer were changed as shown in Table 1. The content of structural units derived from each monomer, the Mw, the dispersity (Mw/Mn), and the yield of each polymer are also shown in Table 1. Note that the symbol "–" in Table 1 indicates that the corresponding monomer component was not used.

TABLE 1

| | | Structural unit (I) | | | Structural unit (II) | | | Structural unit (III) | | | | | |
|---|---|---|---|---|---|---|---|---|---|---|---|---|---|
| | Component (A) | Monomer | Amount of monomer (mol %) | Content in polymer (mol %) | Monomer | Amount of monomer (mol %) | Content in polymer (mol %) | Monomer | Amount of monomer (mol %) | Content in polymer (mol %) | Mw | Mw/Mn | Yield (%) |
| Synthesis Example 1 | A-1 | M-1 | 60.0 | 57.5 | M-4 | 20.0 | 20.5 | M-6 | 20.0 | 22.0 | 7200 | 1.40 | 70 |
| Synthesis Example 2 | A-2 | M-2 | 60.0 | 57.3 | M-4 | 10.0 | 10.2 | M-6 | 30.0 | 32.5 | 6550 | 1.36 | 67 |
| Synthesis Example 3 | A-3 | M-3 | 60.0 | 50.3 | M-4 | 20.0 | 24.5 | M-6 | 20.0 | 25.2 | 5300 | 1.33 | 66 |
| Synthesis Example 4 | A-4 | M-1 M-3 | 30.0 30.0 | 28.6 25.1 | M-4 | 10.0 | 12.8 | M-6 | 30.0 | 33.5 | 5970 | 1.34 | 73 |
| Synthesis Example 5 | A-5 | M-1 M-2 | 30.0 30.0 | 28.0 27.0 | M-4 | 20.0 | 22.1 | M-6 | 20.0 | 22.9 | 6810 | 1.36 | 72 |
| Synthesis Example 6 | A-6 | M-1 M-2 | 30.0 30.0 | 27.7 27.0 | M-4 | 10.0 | 22.2 | M-6 | 30.0 | 23.1 | 6850 | 1.37 | 73 |
| Synthesis Example 7 | A-7 | M-1 | 60.0 | 58.0 | M-5 | 10.0 | 10.8 | M-6 | 30.0 | 31.2 | 7060 | 1.38 | 73 |
| Synthesis Example 8 | a-1 | M-1 | 60.0 | 58.5 | — | — | — | M-6 | 40.0 | 41.5 | 7130 | 1.42 | 73 |
| Synthesis Example 9 | a-2 | M-1 | 50.0 | 47.8 | — | — | — | M-6 | 50.0 | 52.2 | 7300 | 1.34 | 75 |
| Synthesis Example 10 | a-3 | M-3 | 45.0 | 38.1 | M-4 | 30.0 | 32.2 | M-6 | 25.0 | 29.7 | 5520 | 1.34 | 60 |

Preparation of Radiation-sensitive Resin Composition

The following acid generator (B), acid diffusion controller (C), and solvent (D) were used to prepare the radiation-sensitive resin composition.

Acid Generator (B)
(B-1): triphenylsulfonium 1,1,2,2-tetrafluoro-6-(1-adamantanecarbonyloxy)hexane-1-sulfonate Acid Diffusion Controller (C)
(C-1): N-t-butoxycarbonyl-4-hydroxypiperidine Solvent (D)
(D-1): propylene glycol monomethyl ether acetate
(D-2): cyclohexanone
(D-3): γ-butyrolactone Example 1

100 parts by mass of the polymer (A-1) (polymer (A)), 12.6 parts by mass of the acid generator (B-1) (acid generator (B)), 1.3 parts by mass of the acid diffusion controller (C-1) (acid diffusion controller (C)), 1640 parts by mass of the solvent (D-1) (solvent (D)), 700 parts by mass of the solvent (D-2) (solvent (D)), and 30 parts by mass of the solvent (D-3) (solvent (D)) were mixed. The mixture was filtered through a filter having a pore size of 0.05 μm to prepare a radiation-sensitive resin composition (J-1) of Example 1.

Examples 2 to 8 and Comparative Examples 1 to 3

Radiation-sensitive resin compositions (J-2) to (J-8) and (CJ-1) to (CJ-3) of Examples 2 to 8 and Comparative Examples 1 to 3 were prepared in the same manner as in Example 1, except that the type and the amount of each component were changed as shown in Table 2.

Evaluation

The sensitivity and the depth of focus of each radiation-sensitive resin composition were evaluated by the following methods. The evaluation results are shown in Table 2.

Sensitivity

A composition "ARC66" (manufactured by Brewer Science) was spin-coated onto a 12-inch silicon wafer using a coater/developer "CLEAN TRACK ACT 12" (manufactured by Tokyo Electron Ltd.), and pre-baked (PB) at 205° C. for 60 seconds to form an underlayer film (thickness: 105 nm). The radiation-sensitive resin composition was spin-coated onto the underlayer film using the coater/developer, pre-baked (PB) at 100° C. for 60 seconds, and cooled at 23° C. for 30 seconds to form a resist film (thickness: 120 nm).

The resist film was exposed via a mask having a 75 nm hole/170 nm pitch pattern in the direction X and a 225 nm hole/1350 nm pitch pattern in the direction Y using an ArF immersion scanner ("NSR-S610C" manufactured by Nikon Corporation) (NA: 1.20, CROSSPOLE). The resist film was then subjected to PEB on a hot plate of a coater/developer "CLEAN TRACK LITHIUS PRO-i" (manufactured by Tokyo Electron Ltd.), cooled at 23° C. for 30 seconds, subjected to puddle development (10 sec) using a 2.38% tetramethylammonium hydroxide aqueous solution (using the GP nozzle of the development cup), and rinsed with ultrapure water. The wafer was then spin-dried at 2000 rpm for 15 seconds to obtain an evaluation substrate on which a resist pattern was formed.

A dose (mJ/cm$^2$) at which a resist pattern having an X-axis hole length of 70 nm was formed when preparing the evaluation substrate was taken as the optimum dose. The optimum dose was evaluated as the sensitivity. The line width and the line-to-line distance (space width) were measured using a scanning electron microscope ("CG-4000" manufactured by Hitachi High-Technologies Corporation).

Depth of Focus (DOF)

A hole-and-pitch pattern was resolved (at the sensitivity at the above pitch size) via a mask having a 80 nm hole/400 nm pitch pattern in the direction X and a 160 nm hole/1360 nm pitch pattern in the direction Y. A depth of focus (DOF) at which the X-axis hole length was 60 nm or more was measured. The pattern dimensions were measured using a scanning electron microscope ("CG-4000" manufactured by Hitachi High-Technologies Corporation). A case where the depth of focus measured as described above was 120 nm or more was evaluated as "A", and a case where the depth of focus measured as described above was less than 120 nm was evaluated as "B". The depth of focus (nm) and the evaluation results are shown in Table 2.

TABLE 2

| | Radiation-sensitive resin composition | Component (A) | | Acid generator (B) | | Acid diffusion controller (C) | | Solvent (D) | | PEB (° C.) | Sensitivity (mJ/cm$^2$) | Depth of focus | |
|---|---|---|---|---|---|---|---|---|---|---|---|---|---|
| | | Type | Amount (parts by mass) | Type | Amount (parts by mass) | Type | Amount (parts by mass) | Type | Amount (parts by mass) | | | Measured value (nm) | Evaluation |
| Example 1 | J-1 | A-1 | 100 | B-1 | 12.6 | C-1 | 1.3 | D-1/D-2/D-3 | 1640/700/30 | 95 | 27 | 120 | A |
| Example 2 | J-2 | A-2 | 100 | B-1 | 12.6 | C-1 | 1.3 | D-1/D-2/D-3 | 1640/700/30 | 95 | 27 | 120 | A |
| Example 3 | J-3 | A-3 | 100 | B-1 | 12.6 | C-1 | 1.3 | D-1/D-2/D-3 | 1640/700/30 | 95 | 26 | 120 | A |
| Example 4 | J-4 | A-4 | 100 | B-1 | 12.6 | C-1 | 1.3 | D-1/D-2/D-3 | 1640/700/30 | 95 | 27 | 180 | A |
| Example 5 | J-5 | A-5 | 100 | B-1 | 12.6 | C-1 | 1.3 | D-1/D-2/D-3 | 1640/700/30 | 95 | 28 | 180 | A |
| Example 6 | J-6 | A-6 | 100 | B-1 | 12.6 | C-1 | 1.3 | D-1/D-2/D-3 | 1640/700/30 | 95 | 29 | 120 | A |
| Example 7 | J-7 | A-7 | 100 | B-1 | 12.6 | C-1 | 1.3 | D-1/D-2/D-3 | 1640/700/30 | 95 | 30 | 120 | A |
| Example 8 | J-8 | A-1 A-3 | 50 50 | B-1 | 12.6 | C-1 | 1.3 | D-1/D-2/D-3 | 1640/700/30 | 95 | 27 | 150 | A |
| Comparative Example 1 | CJ-1 | a-1 | 100 | B-1 | 12.6 | C-1 | 1.3 | D-1/D-2/D-3 | 1640/700/30 | 110 | 27 | 60 | B |
| Comparative Example 2 | CJ-2 | a-2 | 100 | B-1 | 12.6 | C-1 | 1.3 | D-1/D-2/D-3 | 1640/700/30 | 95 | 27 | 60 | B |
| Comparative Example 3 | CJ-3 | a-3 | 100 | B-1 | 12.6 | C-1 | 1.3 | D-1/D-2/D-3 | 1640/700/30 | 95 | 25 | 30 | B |

As is clear from the results shown in Table 2, the depth of focus could be significantly increased using the radiation-sensitive resin compositions of Examples 1 to 8 as compared with the radiation-sensitive resin compositions of Comparative Examples 1 to 3.

The radiation-sensitive resin composition according to the embodiments of the invention may suitably be used as a photoresist material that will be increasingly required to achieve a reduction in line width of a resist pattern.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a polymer that includes a first structural unit shown by a formula (a1), a second structural unit shown by a formula (a2), and a third structural unit having a lactone structure; and
a photoacid generator, a content of the first structural unit in the polymer being 50 mol % or more based on total structural units included in the polymer,

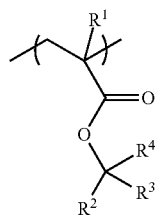
(a1)

wherein $R^1$ represents a hydrogen atom or a methyl group, and
each of $R^2$, $R^3$, and $R^4$ independently represents an alkyl group having 1 to 10 carbon atoms or a monovalent alicyclic hydrocarbon group having 4 to 20 carbon atoms, or
$R^2$ represents an alkyl group having 1 to 10 carbon atoms or a monovalent alicyclic hydrocarbon group having 4 to 20 carbon atoms, and $R^3$ and $R^4$ taken together represent a divalent alicyclic hydrocarbon group having 4 to 20 carbon atoms together with the carbon atom bonded to $R^3$ and $R^4$,

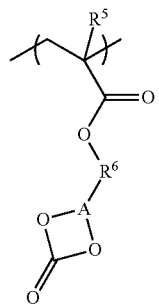
(a2)

wherein
$R^5$ represents a hydrogen atom or a methyl group,
$R^6$ represents a single bond or a divalent hydrocarbon group having 1 to 10 carbon atoms, and
A represents a trivalent organic group.

2. The radiation-sensitive resin composition according to claim 1, wherein the first structural unit is a structural unit shown by a formula (a1-1),

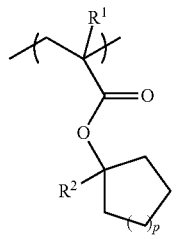
(a1-1)

wherein
each of $R^1$ and $R^2$ is a same as defined for the formula (a1), and
p is an integer from 0 to 4.

3. The radiation-sensitive resin composition according to claim 1, wherein the photoacid generator includes a compound shown by a formula (B1),

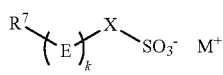
(B1)

wherein
$R^7$ represents a monovalent hydrocarbon group having 10 or more carbon atoms that includes an alicyclic skeleton, wherein the hydrocarbon group represented by $R^7$ is unsubstituted or a part or all of hydrogen atoms of the hydrocarbon group represented by $R^7$ are each substituted with a substituent,
E represents —O—, —CO—O—*, or —O—CO—*, wherein * indicates a site bonded to X,
k is 0 or 1,
X represents a divalent linear or branched alkanediyl group having 1 to 20 carbon atoms, wherein the alkanediyl group represented by X is unsubstituted or a part or all of hydrogen atoms of the alkanediyl group represented by X are each substituted with a substituent, and
$M^+$ represents a monovalent onium cation.

4. The radiation-sensitive resin composition according to claim 3, wherein $R^7$ of the compound shown by the formula (B1) represents a hydrocarbon group that includes an adamantane skeleton.

5. The radiation-sensitive resin composition according to claim 3, wherein the compound shown by the formula (B1) is a compound shown by a formula (B1-1),

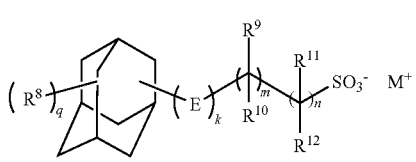
(B1-1)

wherein
each of E, k and $M^+$ is a same as defined for the formula (B1), $R^8$ represents a monovalent hydrocarbon group having 1 to 8 carbon atoms, wherein the hydrocarbon group represented by $R^8$ is unsubstituted or a part or all of hydrogen atoms of the hydrocarbon group represented by $R^8$ are each substituted with a substituent, q is an integer from 0 to 4, wherein a plurality of $R^8$s are either identical or different in a case where q is an integer from 2 to 4, each of $R^9$ and $R^{10}$ independently represents a hydrogen atom or a monovalent hydrocarbon group having 1 to 8 carbon atoms, wherein the hydrocarbon group represented by $R^9$ or $R^{10}$ is unsubstituted or a part or all of hydrogen atoms of the hydrocarbon group represented by $R^9$ or $R^{10}$ are each substituted with a substituent, m is an integer from 0 to 10, wherein each of a plurality of $R^9$s and a plurality of $R^{10}$s are either identical or different in a case where m is an integer from 2 to 10, each of $R^{11}$ and $R^{12}$ independently represents a fluorine atom or a perfluoroalkyl group having 1 to 4 carbon atoms, and n is an integer from 1 to 4, wherein each of a plurality of $R^{11}$s and a plurality of $R^{12}$s are either identical or different in a case where n is an integer from 2 to 4.

6. The radiation-sensitive resin composition according to claim 3, wherein $M^+$ of the compound shown by the formula (B1) represents a cation shown by a formula (b1), a cation shown by a formula (b2), or a combination thereof,

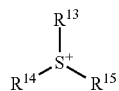 (b1)

wherein each of $R^{13}$, $R^{14}$ and $R^{15}$ independently represents a linear or branched alkyl group having 1 to 10 carbon atoms or an aryl group having 6 to 18 carbon atoms, wherein the alkyl group or the aryl group represented by $R^{13}$, $R^{14}$ and $R^{15}$ is unsubstituted or a part or all of hydrogen atoms of the alkyl group or the aryl group represented by R $R^{13}$, $R^{14}$ and $R^{15}$ are each substituted with a substituent, or $R^{13}$ represents a linear or branched alkyl group having 1 to 10 carbon atoms or an aryl group having 6 to 18 carbon atoms, wherein the alkyl group or the aryl group represented by $R^{13}$ is unsubstituted or a part or all of hydrogen atoms of the alkyl group or the aryl group represented by $R^{13}$ are each substituted with a substituent, and $R^{14}$ and $R^{15}$, taken together represent a cyclic structure together with the sulfur atom bonded to $R^{14}$ and $R^{15}$,

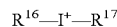 (b2)

wherein each of $R^{16}$ and $R^{17}$ independently represents a linear or branched alkyl group having 1 to 10 carbon atoms or an aryl group having 6 to 18 carbon atoms, wherein the alkyl group or the aryl group represented by $R^{16}$ and $R^{17}$ is unsubstituted or a part or all of hydrogen atoms of the alkyl group or the aryl group represented by $R^{16}$ and $R^{17}$ are each substituted with a substituent, or $R^{16}$ and $R^{17}$ taken together represent a cyclic structure together with the iodine atom bonded to $R^{16}$ and $R^{17}$.

* * * * *